(12) United States Patent
Van Kraaij et al.

(10) Patent No.: US 11,347,151 B2
(45) Date of Patent: May 31, 2022

(54) METHODS AND APPARATUS FOR CALCULATING ELECTROMAGNETIC SCATTERING PROPERTIES OF A STRUCTURE

(71) Applicant: ASML Netherlands B.V., Veldhoven (NL)

(72) Inventors: Markus Gerardus Martinus Maria Van Kraaij, Eindhoven (NL); Maxim Pisarenco, Son en Breugel (NL); Richard Quintanilha, Heidenheim an der Brenz (DE)

(73) Assignee: ASML Netherlands B.V., Veldhoven (NL)

( * ) Notice: Subject to any disclaimer, the term of this patent is extended or adjusted under 35 U.S.C. 154(b) by 386 days.

(21) Appl. No.: 16/394,738

(22) Filed: Apr. 25, 2019

(65) Prior Publication Data
US 2019/0346775 A1 Nov. 14, 2019

(30) Foreign Application Priority Data
May 14, 2018 (EP) ..................................... 18172091

(51) Int. Cl.
*G03F 7/20* (2006.01)
*G01N 21/95* (2006.01)
(Continued)

(52) U.S. Cl.
CPC ..... *G03F 7/70625* (2013.01); *G01N 21/9501* (2013.01); *G01N 21/95607* (2013.01);
(Continued)

(58) Field of Classification Search
CPC ......... G01N 21/9501; G01N 21/95607; G01N 21/47; G03F 7/705; G03F 7/70616;
(Continued)

(56) References Cited

U.S. PATENT DOCUMENTS

| 8,731,882 B2 | 5/2014 | Van Beurden |
| 2011/0098992 A1 | 4/2011 | Van Beurden et al. |

(Continued)

FOREIGN PATENT DOCUMENTS

| EP | 1 628 164 A | 2/2006 |
| JP | 2013/156030 A | 8/2013 |

OTHER PUBLICATIONS

International Search Report and Written Opinion of the International Searching Authority directed to related International Patent Application No. PCT/EP2019/059732, dated Jun. 19, 2019; 12 pages.

(Continued)

*Primary Examiner* — Peter B Kim
(74) *Attorney, Agent, or Firm* — Sterne, Kessler, Goldstein & Fox P.L.L.C.

(57) ABSTRACT

A method of calculating electromagnetic scattering properties of a structure represented as a nominal structure and a structural perturbation, has the steps: 1008 numerically solving a volume integral equation comprising a nominal linear system 1004 to determine a nominal vector field being independent with respect to the structural perturbation; 1010 using a perturbed linear system 1006 to determine an approximation of a vector field perturbation arising from the structural perturbation, by solving a volume integral equation or an adjoint linear system. Matrix-vector multiplication of a nominal linear system matrix convolution operator may be restricted to sub-matrices; and 1012 calculating electromagnetic scattering properties of the structure using the determined nominal vector field and the determined approximation of the vector field perturbation.

15 Claims, 14 Drawing Sheets

(51) Int. Cl.
*G01N 21/956* (2006.01)
*G03F 9/00* (2006.01)
(52) U.S. Cl.
CPC ............ *G03F 7/705* (2013.01); *G03F 7/7065* (2013.01); *G03F 7/70633* (2013.01); *G03F 9/7092* (2013.01)
(58) Field of Classification Search
CPC ............ G03F 7/70625; G03F 7/70633; G03F 7/7065; G03F 7/70675; G03F 9/7092; G03F 1/84
USPC .............. 355/67, 68, 77; 356/399–401, 636; 703/2
See application file for complete search history.

(56) References Cited

U.S. PATENT DOCUMENTS

| | | |
|---|---|---|
| 2011/0218789 A1 | 9/2011 | Van Beurden |
| 2016/0223916 A1 | 8/2016 | Van Beurden |

OTHER PUBLICATIONS

International Preliminary Report on Patentability directed to related International Patent Application No. PCT/EP2019/059732, dated Nov. 17, 2020; 8 pages.

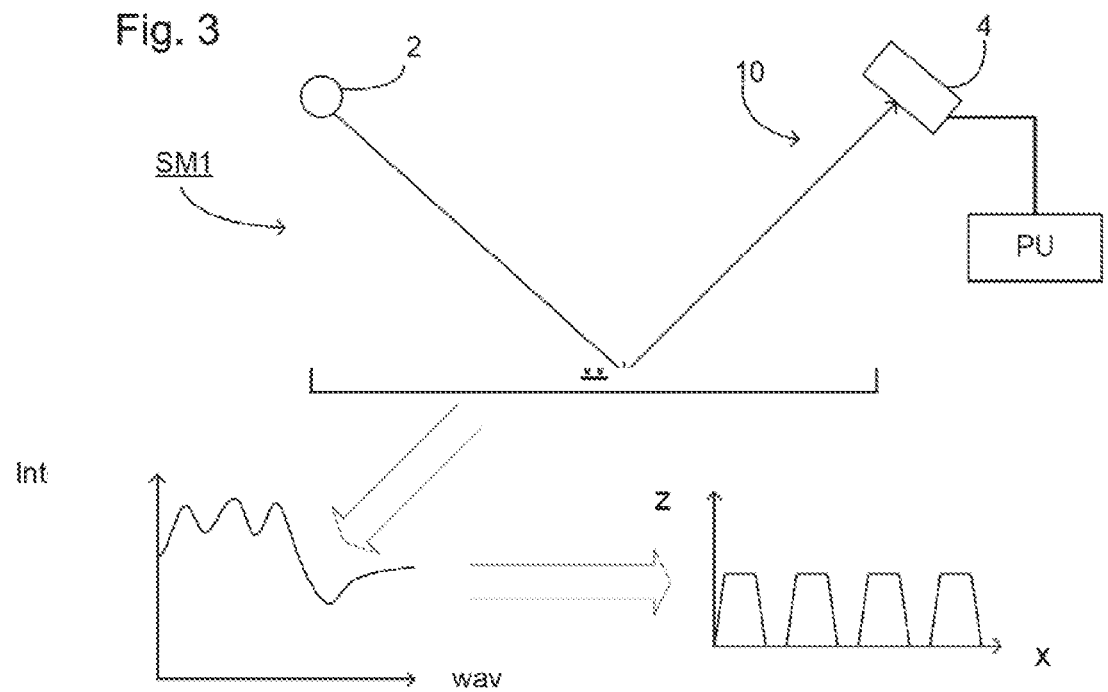
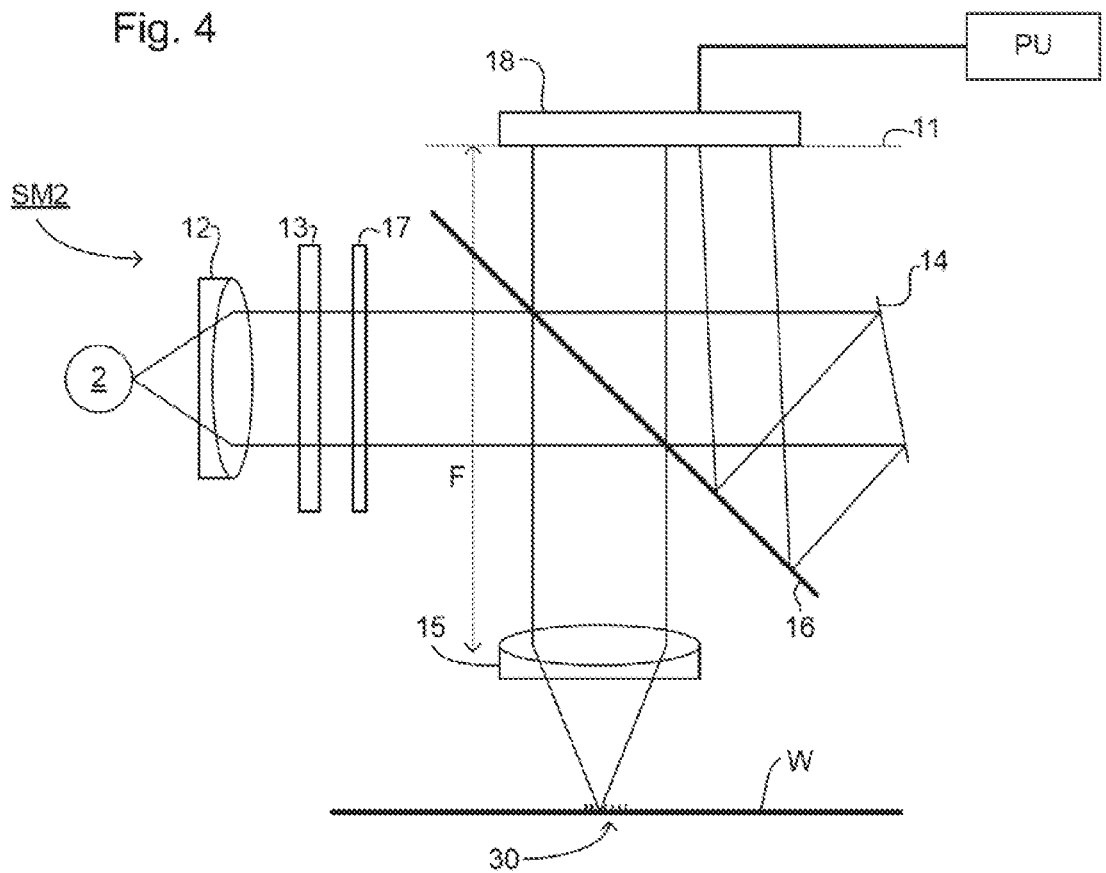

$E(p)$:

$E(p) - GJ(p) = E^{inc}(p)$
$J(p) = \chi(p) * E(p)$

Fig. 11a $dE$:

$dE - GdJ = E^{inc'}(dp)$
$dJ = \chi(p) * dE$

Fig. 11b

METHODS AND APPARATUS FOR CALCULATING ELECTROMAGNETIC SCATTERING PROPERTIES OF A STRUCTURE

FIELD

The present invention relates to calculation of electromagnetic scattering properties of periodic structures having structural perturbations. The invention may be applied for example in metrology of microscopic structures, for example to assess critical dimensions (CD) performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

More generally, it is useful to be able to compare the scattered radiation with scattering behaviors predicted mathematically from models of structures, which can be freely set up and varied until the predicted behavior matches the observed scattering from a real sample. Unfortunately, although it is in principle known how to model the scattering by numerical procedures, the computational burden of the known techniques renders such techniques challenging, particularly if real-time reconstruction is desired, and/or where the structures involved are more complicated than a simple structure periodic in one-dimension.

Improved Volume Integral Methods have been developed to reduce the computational burden to allow real-time reconstruction. Such improved methods are disclosed in US2011218789A1 (granted as U.S. Pat. No. 8,731,882B2) that achieves faster convergence by solving for a continuous vector field, and in US2011098992A1 that adds a projection operator framework to analyze localized normal-vector fields. The disclosures of both documents are hereby incorporated by reference in their entirety. Such improved VIMs are referred to herein as "continuous-vector-field VIMs". A more traditional VIM that uses an electric field in the volume integral is referred to herein as an "electric-field VIM".

In many applications it is useful to simulate the electromagnetic response of gratings containing small imperfections/perturbations around some nominal configuration.

In order to model the response of these types of (perturbed) gratings one typically defines a large computational domain (periodic supercell) in which: an unperturbed/nominal structure is repeated many times; and each instance of the unperturbed structure is (randomly) perturbed.

The resulting supercell is then simulated using a Maxwell solver such as disclosed in US2011218789A1. Although the computational complexity of this solver is already improved, when the supercell becomes really large and/or many random instances of e.g. roughness need to be simulated (in order to derive a statistically accurate response), the overall computation time can still be (too) large.

Moreover, we are often interested in the response of multiple such perturbed configurations. A prominent example is the statistical characterization of line edge roughness (LER) and line width roughness (LWR). In this case the task is to simulate multiple responses for various LER/LWR realizations so that a probability density function of the response can be constructed.

In order to model the response of multiple perturbations one typically defines a sequence of problems with different geometries and simulates the electromagnetic response for each problem independently. With conventional methods, it is necessary to perform a new simulation for each new perturbed geometry which in the end can result in an excessive amount of computation time.

SUMMARY

It is desirable in the field of semiconductor processing to rapidly perform accurate calculations of electromagnetic scattering properties of periodic structures.

It is furthermore desirable to achieve substantial speed improvement of such calculations without compromising significantly on accuracy.

According to a first aspect of the invention, there is provided a method of calculating electromagnetic scattering properties of a structure, the structure being represented as a nominal structure and a structural perturbation, the method comprising:

(d) numerically solving, using a processing device, a volume integral equation comprising a nominal linear system to determine a nominal vector field being independent with respect to the structural perturbation;

(e) using a perturbed linear system to determine an approximation of a vector field perturbation arising from the structural perturbation; and (f) calculating electromagnetic scattering properties of the structure using the determined nominal vector field and the determined approximation of the vector field perturbation.

The method may further comprise:

(a) constructing a nominal linear system matrix to represent material properties of the nominal structure independently with respect to the structural perturbation;

(b) constructing the nominal linear system using the nominal linear system matrix; and (c) approximating the perturbed linear system using the nominal linear system matrix and by discarding second-order interactions between material-property perturbations arising from the structural perturbation and the vector field perturbation.

Preferably, the vector field perturbation comprises a far-field vector field perturbation and the step (e) of using the perturbed linear system to determine an approximation of the vector field perturbation comprises:

(e1) defining a selection vector constructed to select one or more far-field diffraction order of interest;

(e2) determining a nominal far-field vector field by performing an inner product of the selection vector and the determined nominal vector field;

(e3) solving an adjoint linear system having a system matrix being the Hermitian transpose of a nominal linear system matrix, and having the selection vector (g) as its right-hand side, to determine an adjoint solution vector;

(e4) determining the approximation of the far-field vector field perturbation by performing an inner product of the adjoint solution vector and the right-hand side vector of the perturbed linear system; and the step (f) of calculating electromagnetic scattering properties of the structure comprises using the determined nominal far-field vector field and the determined approximation of the far-field vector field perturbation.

Preferably, the structure has a periodic substructure and the nominal linear system comprises a substructure nominal linear system constructed to represent a unit cell of the periodic substructure.

Preferably, step (e) of using the perturbed linear system to determine an approximation of a vector field perturbation comprises restricting matrix-vector multiplication of a nominal linear system matrix convolution operator, which operates in a direction of periodicity of the periodic substructure, with the vector field perturbation, the restricting being to a number of sub-matrices determined by the number of periods of the periodic substructure in the structure.

According to a second aspect of the invention, there is provided a method of reconstructing a structure of an object in an inspection apparatus, the method comprising:

determining, using a processing device, a model of an electromagnetic scattering property of an estimated structure of the object, wherein the determining comprises calculating electromagnetic scattering properties of the structure in accordance with the first aspect;

detecting an electromagnetic scattering property of the object; and comparing, using the processing device, the detected electromagnetic scattering property to the model of the electromagnetic scattering property.

According to a third aspect of the invention, there is provided a method of reconstructing a structure of an object from a detected electromagnetic scattering property arising from illumination of the object by radiation, the method comprising the steps:

estimating at least one object structure;

determining at least one model electromagnetic scattering property from the at least one estimated object structure;

comparing the detected electromagnetic scattering property to the at least one model electromagnetic scattering property; and determining an object structure based on the result of the comparison, wherein the model electromagnetic scattering property is determined using a method of calculating electromagnetic scattering properties of a structure according to the first aspect.

According to a fourth aspect of the invention, there is provided an inspection system for reconstructing an approximate structure of an object, the inspection system comprising:

an illumination system configured to illuminate said object with radiation;

a detection system configured to detect an electromagnetic scattering property arising from said illumination:

a processor configured to:

estimate at least one structural parameter;

determine at least one model electromagnetic scattering property from said at least one structural parameter;

compare said detected electromagnetic scattering property to said at least one model electromagnetic scattering property; and determine an approximate object structure from a difference between said detected electromagnetic scattering property and said at least one model electromagnetic scattering property, wherein said processor is configured to determine said model electromagnetic scattering property using a method according to the first aspect.

According to a fifth aspect of the invention, there is provided a lithographic cell comprising the inspection system of the fourth aspect.

According to a sixth aspect of the invention, there is provided a computer program product containing one or more sequences of machine-readable instructions for calculating electromagnetic scattering properties of a structure, the instructions being adapted to cause one or more processors to perform a method according to the first aspect.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts a first scatterometer;

FIG. 4 depicts a second scatterometer;

FIGS. 11a and 11b illustrate steps of FIG. 10 in an embodiment of the present invention using a numerical solution of the VIM formula;

DETAILED DESCRIPTION

Figure 1:
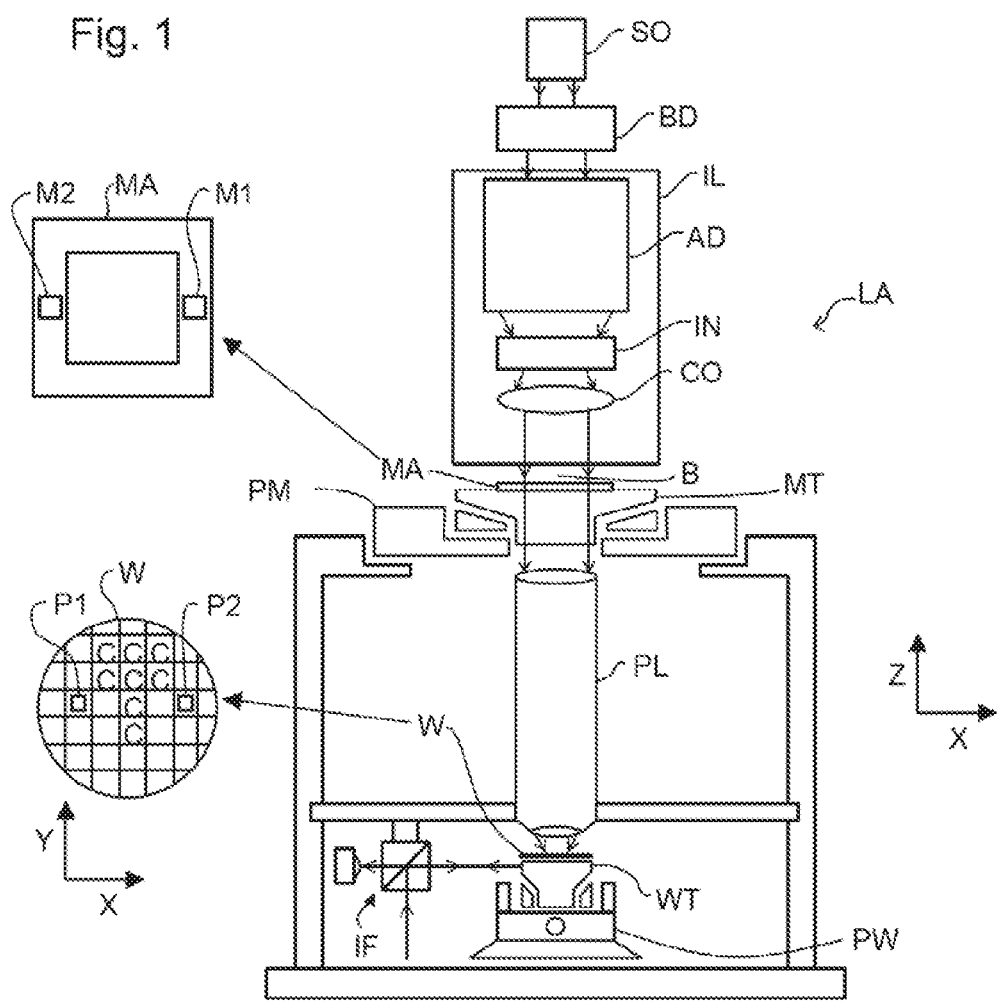
FIG. 1 depicts a lithographic apparatus.

FIG. 1 schematically depicts a lithographic apparatus. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
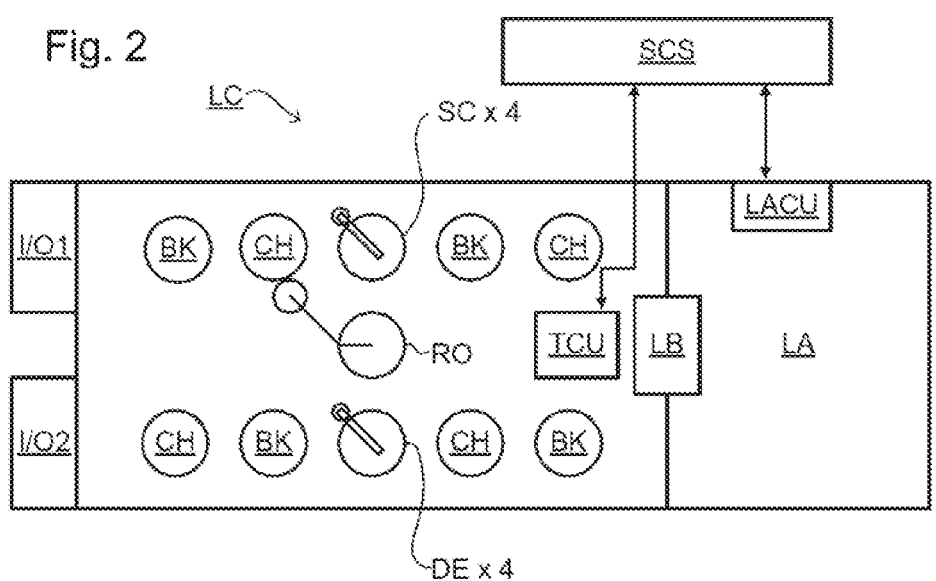
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer which may be used in an embodiment of the present invention. It comprises a broad-band (white light) radiation projector 2 which projects radiation onto a substrate W. The reflected radiation is passed to a spectrometer detector 4, which measures a spectrum 10 (intensity (Int) as a function of wavelength (way)) of the specular reflected radiation. From this data, the structure or profile giving rise to the detected spectrum may be reconstructed by processing unit PU, e.g. conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Modelling

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate or aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
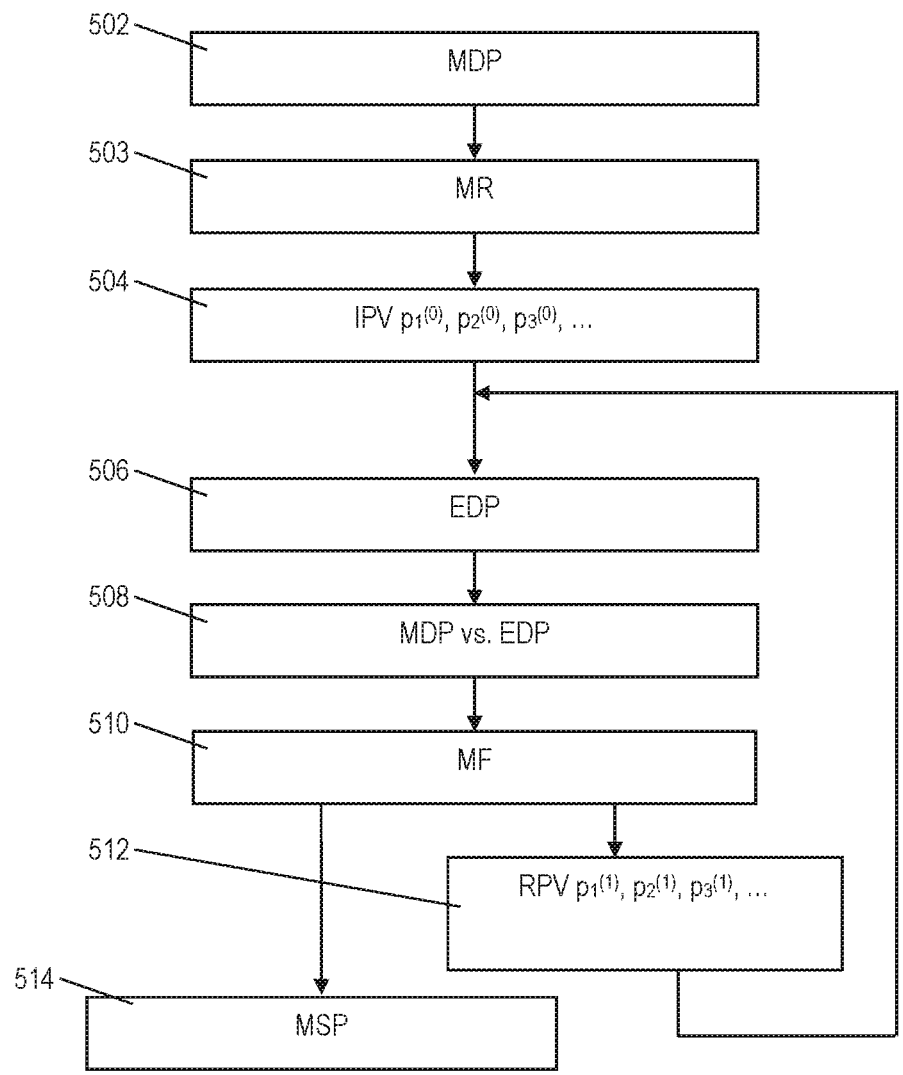
FIG. 5 depicts a first example process using an embodiment of the invention for reconstruction of a structure from scatterometer measurements.

Referring to FIG. 5 in more detail, the way the measurement of the target shape and/or material properties is carried out will be described in summary. The target will be assumed for this description to be a 1-dimensional (1-D) structure. In practice it may be 2-dimensional, and the processing will be adapted accordingly.

502: The diffraction pattern of the actual target on the substrate is measured using a scatterometer such as those described above. This measured diffraction pattern (MDP) is forwarded to a calculation system such as a computer. The calculation system may be the processing unit PU referred to above, or it may be a separate apparatus.

503: A 'model recipe' (MR) is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters $p_i$ 504: A model target shape is estimated by setting initial parameter values (IPV) $p_i^{(0)}$ for the floating parameters (i.e. $p_1^{(0)}$, $p_2^{(0)}$, $p_3^{(0)}$ and so on). Each floating parameter will be generated within certain predetermined ranges, as defined in the recipe.

506: The shape parameters representing the estimated shape, together with the optical properties of the different scattering elements of the model, are used to calculate the scattering properties, for example using a rigorous optical diffraction method such as RCWA or any other solver of Maxwell equations. This gives an estimated or model diffraction pattern (EDP) of the estimated target shape.

508, 510: The measured diffraction pattern MDP and the model or estimated diffraction EDP pattern are then compared and their similarities and differences are used to calculate a "merit function" (MF) for the model target shape.

512: Assuming that the merit function indicates that the model needs to be improved before it represents accurately the actual target shape, new revised parameter values (RPV) $p_1^{(1)}$, $p_2^{(1)}$, $p_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

514: When the merit function indicates that this iterative process has converged on a solution with a desired accuracy, the currently estimated parameters are reported as the measurement of the actual target structure or measured shape parameters (MSP).

The computation time of this iterative process is largely determined by the forward diffraction model used, i.e. the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 510. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
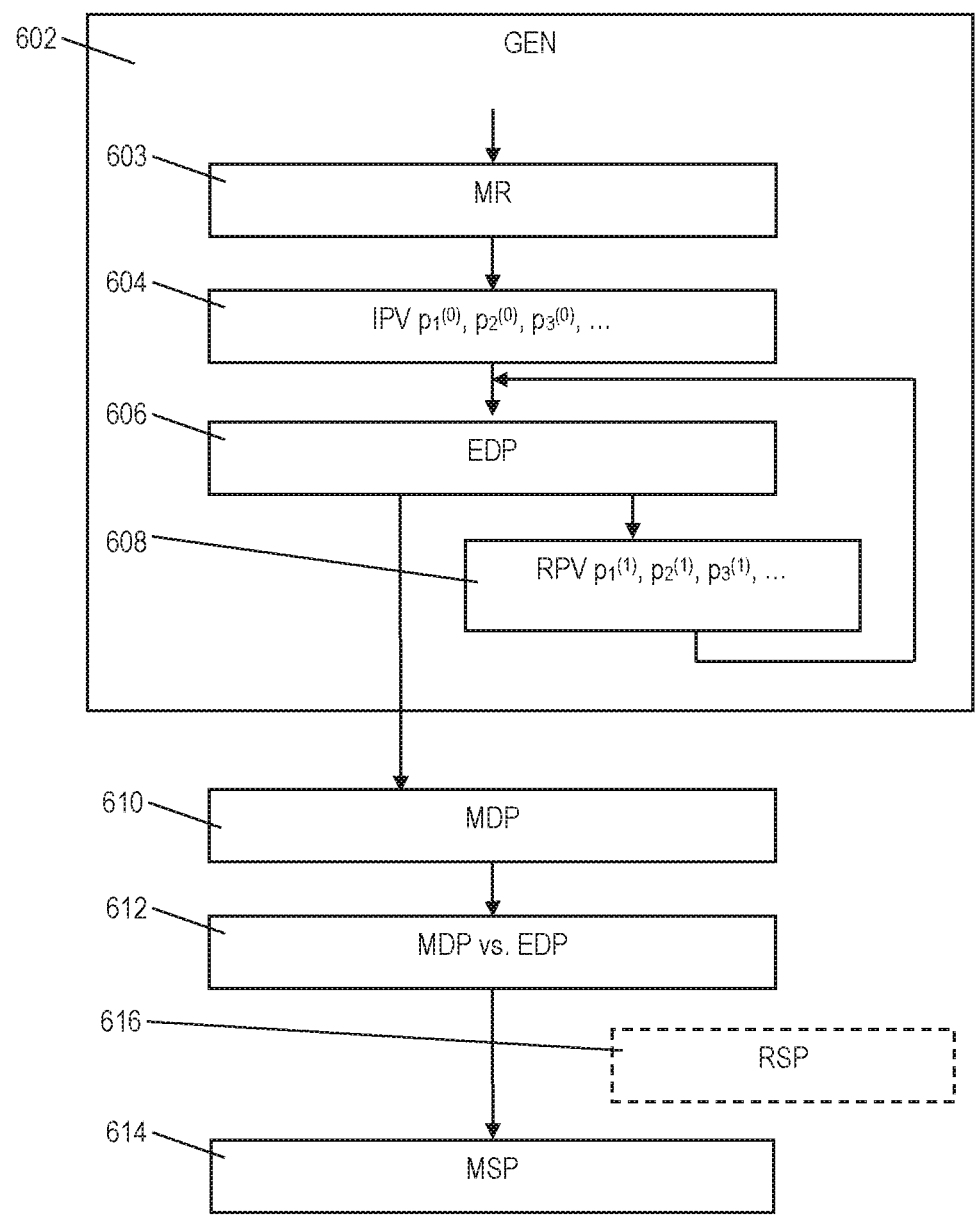
FIG. 6 depicts a second example process using an embodiment of the invention for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

602: The process of generating (GEN) the library begins. A separate library may be generated for each type of target structure. The library may be generated by a user of the measurement apparatus according to need, or may be pre-generated by a supplier of the apparatus.

603: A 'model recipe' (MR) is established which defines a parameterized model of the target structure in terms of a number of parameters $p_i$ ($p_1$, $p_2$, $p_3$ and so on). Considerations are similar to those in step 503 of the iterative process.

604: A first set of initial parameter values (IPV) $p_1^{(0)}$, $p_2^{(0)}$, $p_3^{(0)}$, etc. is generated, for example by generating random values of all the parameters, each within its expected range of values.

606: A estimated or model diffraction pattern (EDP) is calculated and stored in a library, representing the diffraction pattern expected from a target shape represented by the parameters.

608: A new set of revised shape parameter values (RPV) $p_1^{(1)}$, $p_2^{(1)}$, $p_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

610: After the library is generated (though it could be before), the real target 30 is placed in the scatterometer and its measured diffraction pattern (MDP) is measured.

612: The measured pattern (MDP) is compared with the estimated or modeled diffraction patterns (EDP) stored in the library to find the best matching pattern. The comparison may be made with every sample in the library, or a more systematic searching strategy may be employed, to reduce computational burden.

614: If a match is found then the estimated target shape used to generate the matching library pattern can be determined to be the approximate object structure. The shape parameters corresponding to the matching sample are output as the measured shape parameters (MSP). The matching process may be performed directly on the model diffraction signals, or it may be performed on substitute models which are optimized for fast evaluation.

616: Optionally, the nearest matching sample is used as a starting point, and a refinement process (refine shape parameters, RSP) is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e. the calculation of the estimated model diffraction pattern using a rigorous optical diffraction theory from the estimated target shape.

For CD reconstruction of 2D-periodic structures RCWA is commonly used in the forward diffraction model, while the Differential Method, the Volume Integral Method (VIM), Finite-difference time-domain (FDTD), and Finite element method (FEM) have also been reported.

Figure 7A:
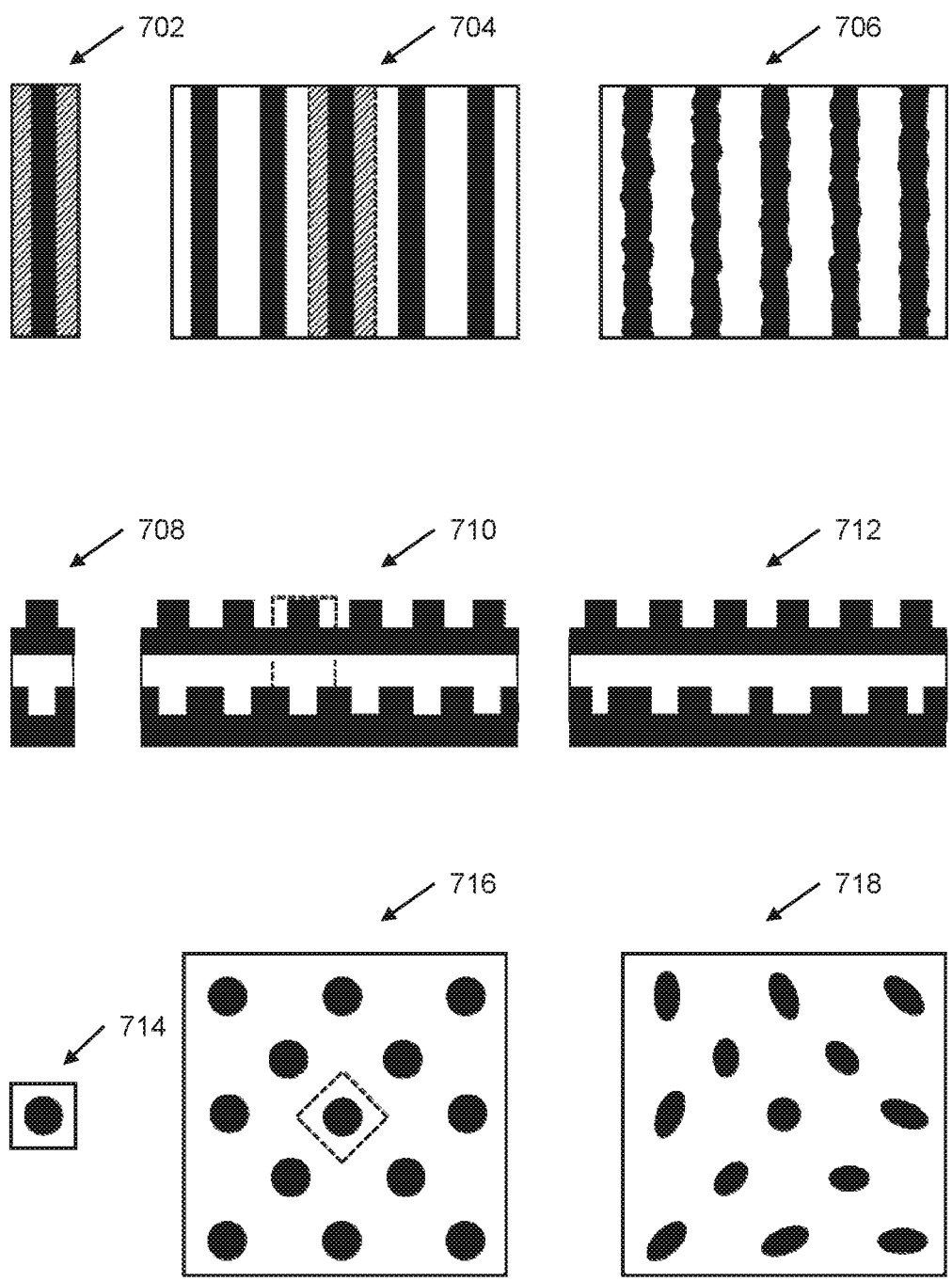
FIG. 7a depicts gratings containing small imperfections/perturbations around some nominal configuration.

FIG. 7a depicts gratings containing small imperfections/perturbations around some nominal configuration.

With reference to FIG. 7a, schematic top views 702-706 of line-space patterns are shown. These are: a single line that is 1D-periodic 702; multiple identical unperturbed lines in a 1D-periodic supercell 704; and multiple perturbed lines in a 2D-periodic supercell 706.

Schematic side views 708-712 of an overlay grating are also shown. These are: a unit cell 708 of a single line (top and bottom) 1D-periodic grating; multiple identical lines (top and bottom) 710 in a 1D-periodic supercell; and multiple perturbed lines (top and bottom) 712 in a 1D-periodic supercell.

Schematic top views 714-718 of part of a hologram are also shown: These are: a single unit cell 714 having an object that is 2D-periodic; multiple identical objects 716 in a 2D-periodic supercell with the unit cell depicted with a dashed line; and multiple perturbed objects 718 in a 2D-periodic supercell.

The result of simulations of structures such as shown in FIG. 7a can be used to derive specifications for new sensor designs or get additional (physical) insight into signal formation for a particular sensor. Embodiments more rapidly provide results of such simulations, which are useful for design of metrology tools that are able to characterize LER very accurately. Conventional metrology tools may be designed to measure just overlay. However, such simulations are useful for designing metrology tools that measure overlay and LER with the same tool. For design of edge placement error metrology tools, where roughness plays an important role as well, such rapid simulations are also useful. Some examples are:

Investigating the effect of line edge roughness (LER) in multiple perturbed lines in a 2D-periodic supercell 706.

Studying the effect on overlay of an intentional programmed CD variation in the bottom grating 712, typically used to counteract strong signals from the top grating This structure, with four lines, can also be used to simulate variation induced by quadruple patterning.

Characterizing the quality of (part of) a computer-generated hologram 718 containing gradually varying objects.

Some other perturbations/imperfections similar to the LER example could include: inhomogeneity of refractive indices n and k in gratings due to locally induced stress or deposition variations, etc.; and anisotropy of amorphous carbon (aC).

With reference to the line-space patterns 702-706 in FIG. 7a, ultimately we want to model the electromagnetic response of a line space pattern 706 that due to the added roughness needs to be modelled as a 2D-periodic configuration in a supercell. By using a perturbation analysis on the unperturbed structure we can link the results to the much simpler structures 702, 704 (which are in this case 1D-periodic and thus much faster to solve).

For the use case with multiple perturbed lines in a 2D-periodic supercell 706 we would iteratively solve the large linear system $$A(p+dp)x(p+dp)=b(p+dp), \quad (1)$$

where p corresponds to the multiple unperturbed identical lines in a 1D-periodic supercell 704 and where p+dp are the perturbed line space patterns 706 depicted in FIG. 7a.

The (geometric) difference dp is typically small (with respect to the wavelength) and could also include a perturbation in material properties like the refractive indices (n, k) (variation of optical properties due to layer stress on wafers, inhomogeneity induced by the deposition technique, etc.). For the use case with multiple identical unperturbed lines 704 in a 1D-periodic supercell, the large linear system would take the form $$A(p)x(p)=b(p). \quad (2)$$

As a further simplification we also have the small linear system corresponding to the use case for a single line 702 that is 1D-periodic $$\hat{A}(p)\hat{x}(p)=\hat{b}(p). \quad (3)$$

1). The first observation is that we can easily construct the solution of (2) by solving only (3) and thus avoid solving (2) altogether. In this example where the supercell is created by only copying lines in one periodic direction, we would zero-pad the solution on the additional harmonics that the larger supercell would introduce in multiple identical unperturbed lines 704 in a 1D-periodic supercell, i.e.

$$x(p):=[\hat{x}_1(p),0,\ldots,0,\hat{x}_2(p),0,\ldots,0,\ldots\hat{x}_N(p),\\0,\ldots,0]. \quad (4)$$

2). The second observation is that we can rewrite the large and complicated linear system in (1) in the following way $$A(p+dp)x(p+dp)=(A(p)+dA)(x(p)+dx)=b(p)+db. \quad (5)$$

If the perturbations are not extremely large we can ignore the product of dA dx and thus approximate this linear system by $$A(p)dx=db-dAx(p), \quad (6)$$

where we have also used equation (2) to arrive at (6). Having solved for dx one can now easily construct an approximation of x(p+dp) by adding dx to x(p) as defined by equation (4).

3). The third observation is that iteratively solving equation (6) can be done substantially faster than the conventional approach of solving the perturbed system in (1) in a continuous-vector-field VIM:

a) Building the righthand side of equation (6) requires the solution x(p) which we constructed in (4) by solving a cheap and much smaller system in (2). Constructing the quantities db and dA are cheap as well and do not involve solving any linear system (and are thus comparable to the regular pre-processing in continuous-vector-field VIM and actually comparable to building A(p+dp) for the perturbed system in (1)). Therefore, the overall construction of the righthand side vector in (6) is cheap.

b) Building the system matrix A(p) is also standard continuous-vector-field VIM pre-processing and thus cheap. In this example it is actually cheaper than building the system matrix for the perturbed system. This is because the multiple identical lines in a 1D-periodic supercell unperturbed geometry 704 depicted in FIG. 7a contains just simple straight lines for which the pre-processing is simpler than for the geometry with multiple perturbed lines 706 in a 2D-periodic supercell depicted in FIG. 7a.

c) Although both systems are of the same size and both have a comparable conditioning (thus resulting in roughly the same number of iterations when solving them), it is the cost per iteration that is substantially smaller in (6) compared to (1).

In order to quantify the speed improvement as mentioned in point 3)c above, we analyze in more detail the cost per iteration for the specific continuous-vector-field VIM algorithm. Recall that the system matrix in continuous-vector-field VIM has the following form (with notation given in Table 3)

$$A(p)=C(p)-GM(p). \quad (7)$$

Roughly speaking, one iteration corresponds to one matrix-vector multiplication with the matrix A where the cost is split (40%-20%-40%) for the multiplication with C, G and M respectively.

Since the matrix G does not depend on the parameter p, the cost per iteration of applying this matrix is the same in both (1) and (6). However, the cost of multiplying with the matrix C(p) is actually much cheaper than multiplying with C(p+dp) (and since C and M are closely related matrices, the same argument holds for M as well. For this reason, we will focus on C below).

At the lowest relevant discretization level (i.e. at the level of the Fourier harmonics along the periodic directions) the matrix C(p+dp) is full and has a Block-Toeplitz-Toeplitz-Block (BTTB) structure which is directly related to the Fourier transform of the geometry. Its matrix-vector multiplication is implemented using Fast Fourier Transforms (FFTs) with a computational complexity of $O(N_x N_y \log(N_x N_y))$ where $N_x$ and $N_y$ are the number of harmonics along the periodic directions x and y for the large supercell.

On the other hand the matrix C(p) is much sparser and in general has a computational complexity of $O(K_x K_y \hat{N}_x \hat{N}_y \log(\hat{N}_x \hat{N}_y))$ where $\hat{N}_x$ and $\hat{N}_y$ are the number of harmonics along the periodic directions x and y for the small unitcell and where $K_x$ and $K_y$ are the number of repeats along x and y to arrive from the small unitcell to the large supercell. There is an obvious relation $N_x = K_x \hat{N}_x$ and $N_y = K_y \hat{N}_y$. This new computational complexity for C(p) can be understood from the fact that for a perfect repetition of the unperturbed periodic structure 704 depicted in FIG. 7a, many Fourier coefficients are actually 0. More precisely, only the Fourier modes which are integer multiples of the repeats $K_x$ and $K_y$ are non-zero. At this level the matrix remains in BTTB and thus we can still employ FFTs for its matrix-vector multiplication (just spread out over smaller sub-matrices).

A rough estimate of the speed improvement can be derived from comparing the computational complexity $O(N_x N_y \log(N_x N_y))=O(K_x K_y \hat{N}_x \hat{N}_y \log(K_x K_y \hat{N}_x \hat{N}_y))$ vs. $O(K_x K_y \hat{N}_x \hat{N}_y \log(\hat{N}_x \hat{N}_y))$. At first glance the difference is only the factor $K_x K_y$ in the logarithm, but the FFT implementation does make it slightly harmonic dependent as well. Some simplified numerical tests show the following improvements for a multiplication with

TABLE 1 estimated speed improvements where $\hat{N}_x$ and $\hat{N}_y$ are the reported single-sided harmonics and $K_x$ and $K_y$ the number of repeats.

| $\hat{N}_x = \hat{N}_y$ | 5 | 10 | 15 |
|---|---|---|---|
| $K_x = K_y = 5$ | 0.8 | 1.0 | 1.4 |
| $K_x = K_y = 25$ | 1.2 | 1.6 | 2.2 |
| $K_x = K_y = 50$ | 1.3 | 2.0 | 2.6 |

An improvement factor of 2.0 means that a multiplication of C has become twice cheaper (which thus also holds for M). Realizing that C and M make up ~80% of the total cost of a matrix-vector product, we would see a 1.7× speed improvement for the overall continuous-vector-field VIM simulation.

It is important to note that the example from 704-706 in FIG. 7a will get a much larger improvement, because the original 2D-periodic structure reduces to a 1D-periodic structure. This effectively means that we should compare the computational complexity of $O(K_x \hat{N}_x \hat{N}_y \log(K_x \hat{N}_x \hat{N}_y))$ vs $O(K_x \hat{N}_x \log(\hat{N}_x))$ (because the harmonics along y reduce to a diagonal multiplication). The corresponding speed improvement is now much larger for a multiplication with C.

TABLE 2 estimated speed improvements where $\hat{N}_x$ and $\hat{N}_y$ are the reported single-sided harmonics and $K_x$ is the number of repeats (recall that $K_y = 1$ and fixed).

| $\hat{N}_x = \hat{N}_y$ | 5 | 10 | 15 |
|---|---|---|---|
| $K_x = 5$ | 15 | 16 | 18 |
| $K_x = 25$ | 40 | 45 | 55 |
| $K_x = 50$ | 70 | 80 | 100 |

These numbers show that the multiplication with C and M is practically for free and the resulting matrix-vector will be dominated by the multiplication with G which still takes 20% of the overall time. Therefore, for this case we would see a 5× speed improvement for the overall continuous-vector-field VIM simulation.

As described above with reference to FIG. 7a, simulation can be accelerated using an embodiment of the present invention if the geometry consists of repeating structures within a single supercell. However, even with this approach, we are still forced to perform a new simulation for each new perturbed geometry which in the end can result in an excessive amount of computation time.

The approach described above can be leveraged to exploit the fact that only a low dimensional response is required (such as far-field reflection coefficients) in order to reduce the computational cost from K linear problems (K being the number of perturbed profiles) to a single linear problem followed by K cheap inner products thereby gaining a substantial reduction in computation time. The geometries do not necessarily need to consist of repeating structures, although if they do the speed improvements are multiplicative.

Figure 7B:
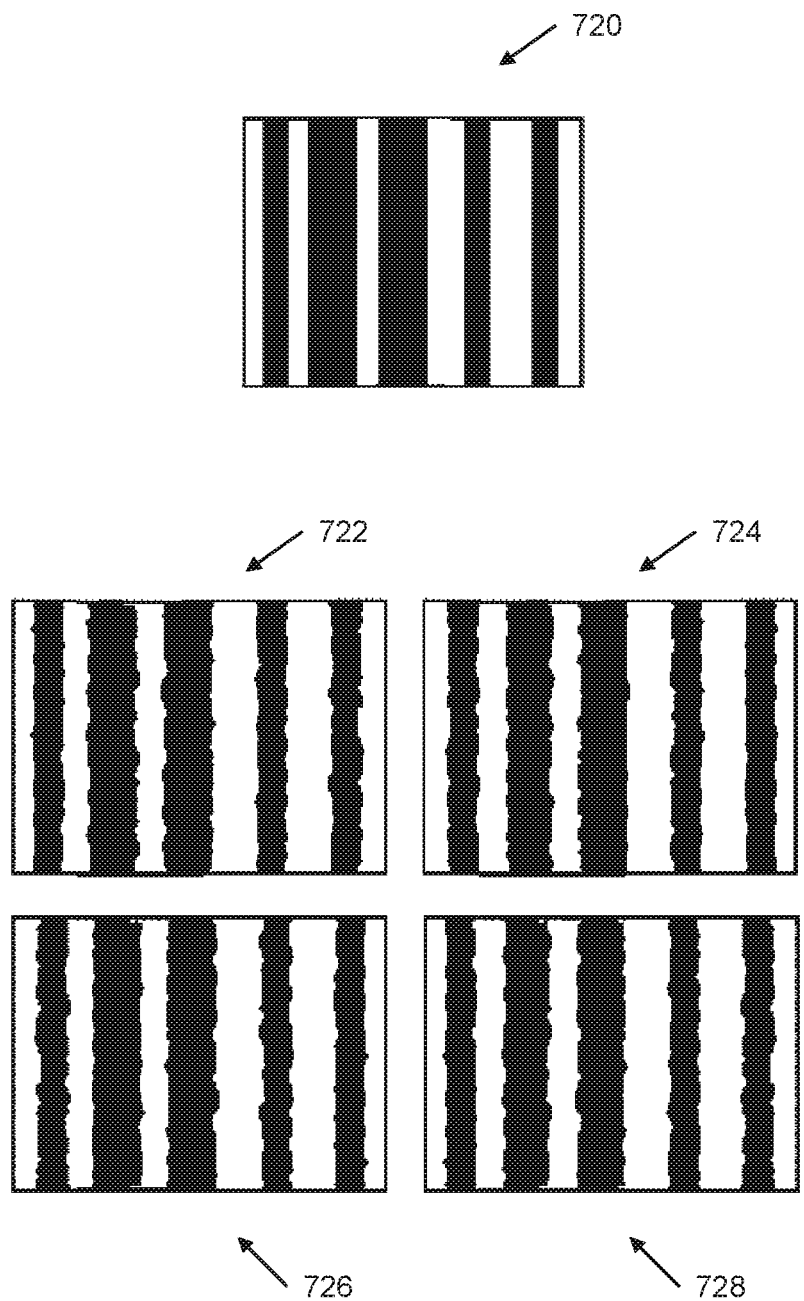
FIG. 7b depicts a schematic top view of an unperturbed non-periodic structure and four different line-edge roughness (LER) realizations of a non-periodic structure.

FIG. 7b depicts a schematic top view of an unperturbed non-periodic structure and four different line-edge roughness (LER) realizations of a non-periodic structure.

Rather than computing a single electromagnetic response of the multiple perturbed lines 706 in a 2D-periodic supercell depicted in FIG. 7a, we compute multiple responses for various random perturbations. Four examples of such perturbed patterns 722-728 are shown in FIG. 7b.

Let p describe the geometry that corresponds to the unpertubed non-periodic pattern 720 in FIG. 7b and p+dp describe the perturbed patterns 722-728 in FIG. 7b. The (geometric) difference dp is typically small and could also include a perturbation in material properties like the refractive indices (n, k). In the description with reference to FIG. 7b above, we have shown how (under the assumption of sufficiently small perturbations) the linear system of equation (1)

$$A(p+dp)x(p+dp)=b(p+dp), \quad (1)$$

can be approximated by $$A(p)dx=b'(dp), \quad (6a)$$

where $$b'(dp)=db-dAx(p). \quad (6b)$$

Conventionally, it would appear that for each new perturbation a new linear system would need to be solved. However, let us observe that:

1. For each new perturbation dp the system matrix $A(p)$ does not change. Only quantities that depend on dp, such as db and dA will change. Thus, only the right-hand side in equation (6a) changes.

2. The solution dx contains the entire electromagnetic field in the near-field of the (perturbed) structure. If we are only interested in the far-field (as is typically the case), then the following low-dimensional quantity will be computed:

$$dr=<g,dx>=<g,A(p)^{-1}b'(dp)>. \quad (8)$$

Here the operator $<.,.>$ denotes the inner product.

Using the above two observations in combination with the property $<v, Lw>=<L^H v, w>$, where $L^H$ denotes the Hermitian transpose of the operator L, equation (3) is rewritten as $$dr=<(A(p)^{-1})^H g, b'(dp)>=<h,b'(dp)>, \quad (9)$$

where $h$ is the solution of $$A(p)^H h=g. \quad (10)$$

Since all the quantities in equation (10) are independent of the perturbation dp, this linear system has to be solved only once. The far-field electromagnetic response for different perturbations dp is computed by cheap inner products $<h,b'(dp)>$ according to equation (9).

Thus, for K perturbed geometries and D diffraction orders of interest, we have replaced K linear system solves by a single solve of the nominal system and D solves of the adjoint linear system, followed by K*D inner products. The obtained speed-up factor is approximately given by K/(D+1) (since the cost of the inner product is negligible relative to the cost of the linear system solve).

Figure 8:
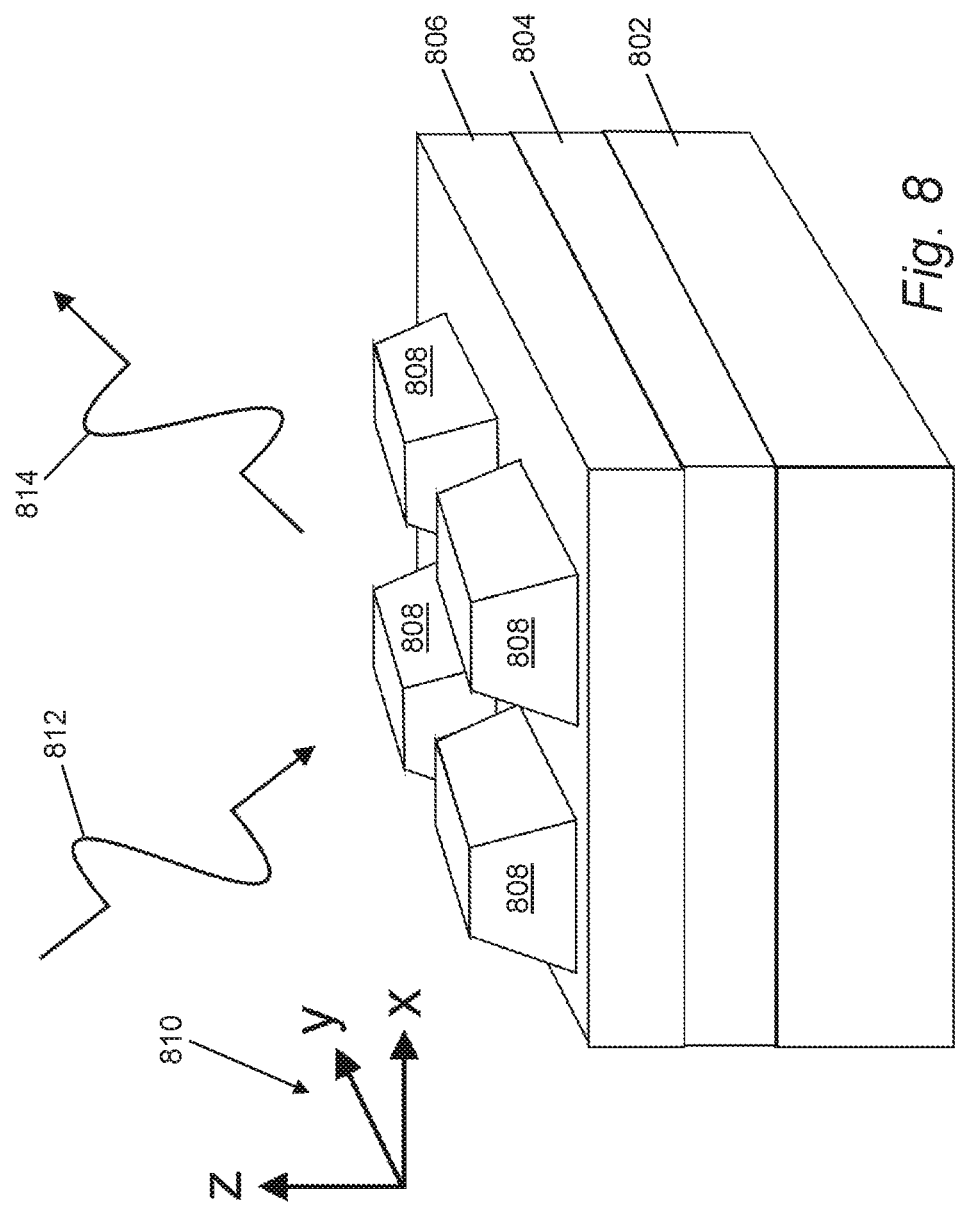
FIG. 8 depicts the scattering geometry that may be reconstructed in accordance with an embodiment of the present invention.

FIG. 8 illustrates schematically the scattering geometry that may be reconstructed in accordance with an embodiment of the present invention. A substrate 802 is the lower part of a medium layered in the z direction. Other layers 804 and 806 are shown. A two-dimensional grating 808 that is periodic in x and y is shown on top of the layered medium. The x, y and z axes are also shown 810. An incident field 812 interacts with and is scattered by the structure 802 to 808 resulting in a reflected field 814. Thus, the structure is periodic in at least one direction, x, y, and includes materials of differing properties such as to cause a discontinuity in an electromagnetic field, $E^{tot}$, that comprises a total of incident, $E^{inc}$, and scattered, $E^s$, electromagnetic field components at a material boundary between the differing materials.

Figure 9:
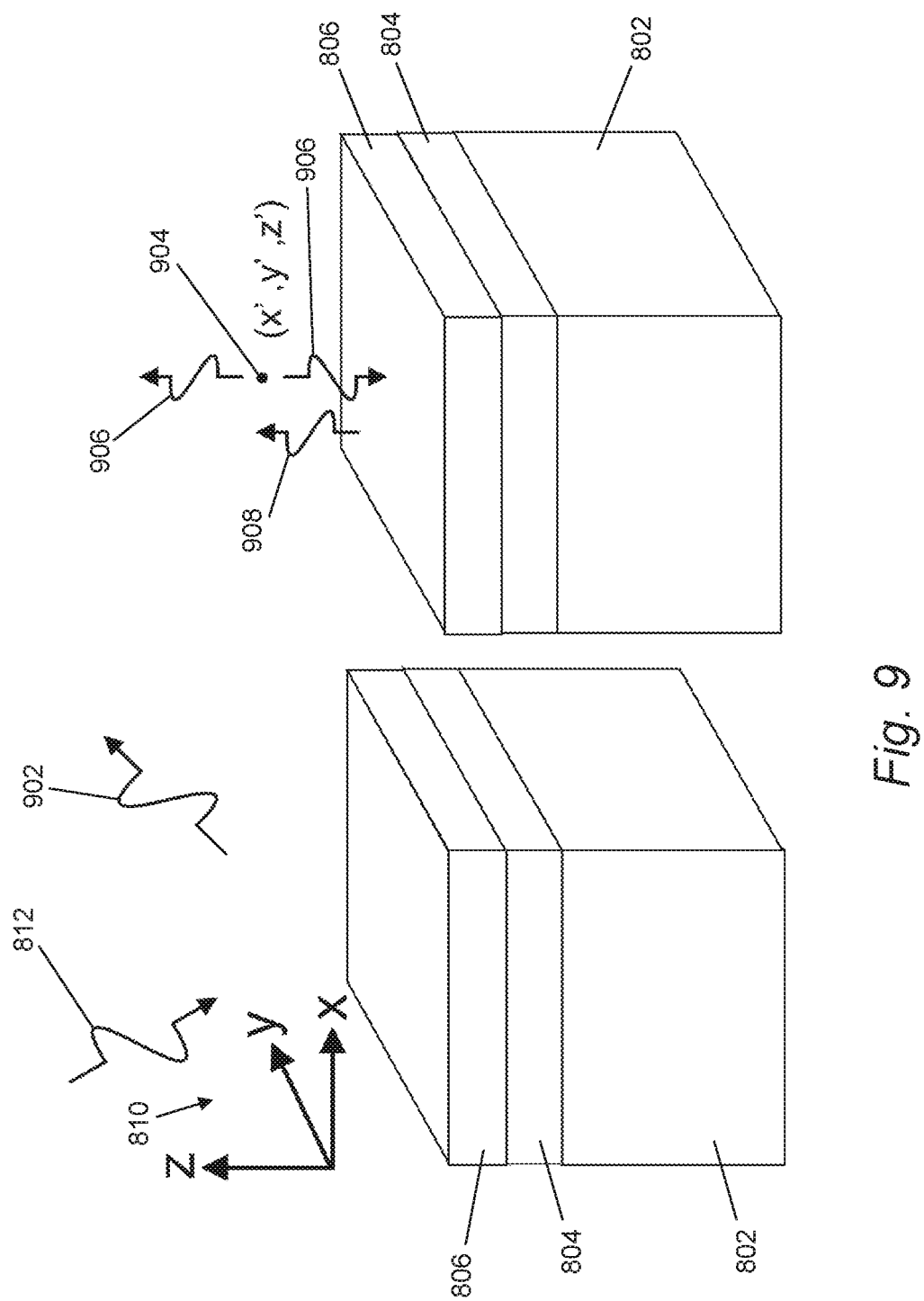
FIG. 9 depicts the structure of the background and illustrates use of a Green's function to calculate the interaction of the incident field with the layered medium.

FIG. 9 shows the structure of the background and schematically illustrates the Green's function that may be used to calculate the interaction of the incident field with the layered medium. The layered medium 802 to 806 is labeled the same as in FIG. 8. The x, y and z axes are also shown 810 along with the incident field 812. A directly reflected field 902 is also shown. The point source (x', y', z') 904 represents the Green's function interaction with the background that generates a field 906. In this case because the point source 904 is above the top layer 806 there is only one background reflection 908 from the top interface of 806 with the surrounding medium. If the point source is within the layered medium then there will be background reflections in both up and down directions (not shown).

The VIM formula to be solved for the nominal structure is $$E^{inc}(x,y,z)=E^{tot}(x,y,z)-\iiint \overline{\overline{G}}(x,x',y,y',z,z')J^c(x',y',z')dx'dy'dz' \quad (11)$$

$$J^c(x',y',z')=\chi(x',y',z')E^{tot}(x',y',z') \quad (12)$$

In this equation, the incident field $E^{inc}$ is a known function of angle of incidence, polarisation and amplitude, $E^{tot}$ is the total electric field that is unknown and for which the solution is calculated, $J^c$ is the contrast current density, $\overline{\overline{G}}$ is the Green's function (a 3×3 matrix), $\chi$ is the contrast function given by $(\varepsilon_r(x,y,z,)/\varepsilon_{r,bac}(z)-1)$, where $\varepsilon_r$ is the relative permittivity of the structure and $\varepsilon_{r,bac}$ is the relative permittivity of the background medium. $\chi$ is zero outside the gratings.

The Green's function $\overline{\overline{G}}(x,x', y,y', z,z')$ is known and computable for the layered medium including 802 to 806. The Green's function shows a convolution and/or modal decomposition $(m_1, m_2)$ in the xy plane and the dominant computation burden along the z axis in $\overline{\overline{G}}$ are convolutions.

For discretization, the total electric field is expanded in Bloch/Floquet modes in the xy plane. Multiplication with $\chi$ becomes: (a) discrete convolution in the xy plane (2D FFT); and (b) product in z. The Green's function interaction in the xy plane is an interaction per mode. The Green's function interaction in z is a convolution that may be performed with one-dimensional (1D) FFTs with a complexity O(N log N).

The number of modes in xy is $M_1 M_2$ and the number of samples in z is N. The efficient matrix-vector product has a complexity $O(M_1 M_2 N \log(M_1 M_2 N))$ and the storage complexity is $O(M_1 M_2 N)$.

The VIM solution method for Ax=b is performed using an iterative solver based on a Krylov subspace method, e.g. BiCGstab(l) (Stabilized BiConjugate Gradient method), which typically has the steps:

Define residual error as $r_n = b - A x_n$

Compute update vector(s) $v_n$ via residual error

Update solution: $x_{n+1} = x_n + \alpha_n v_n$

Update residual error $r_{n+1} = r_n - \alpha_n A v_n$

The terms used herein relate to the notation used in equations (1) to (7) in a general sense. For the specific embodiments described below, other notations are used as described in the following Table.

TABLE 3

Terms and notation used in the embodiments.

Figure 10:
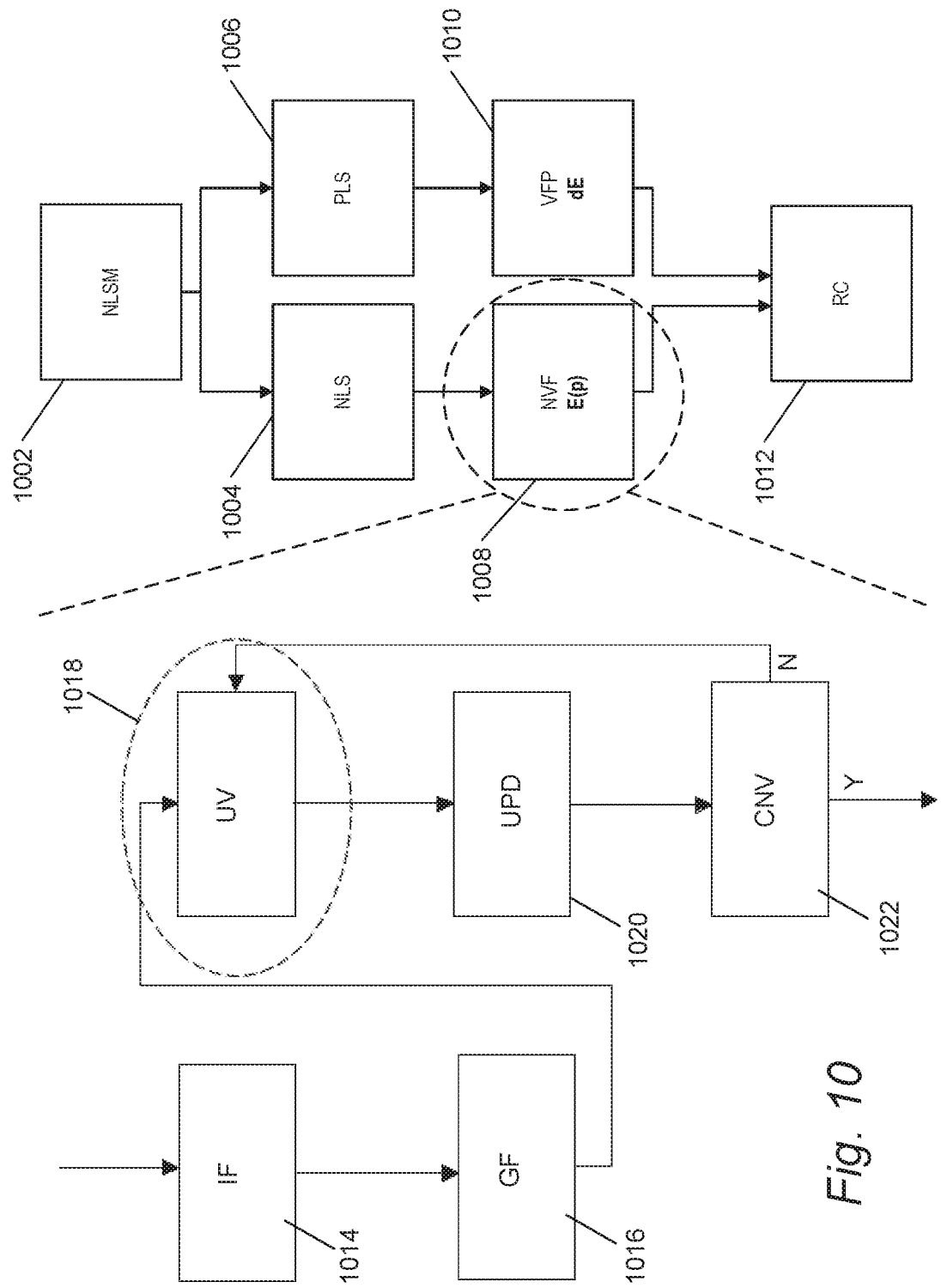
FIG. 10 is a flow chart of a method of calculating electromagnetic scattering properties in accordance with an embodiment of present invention.
Figure 12A:
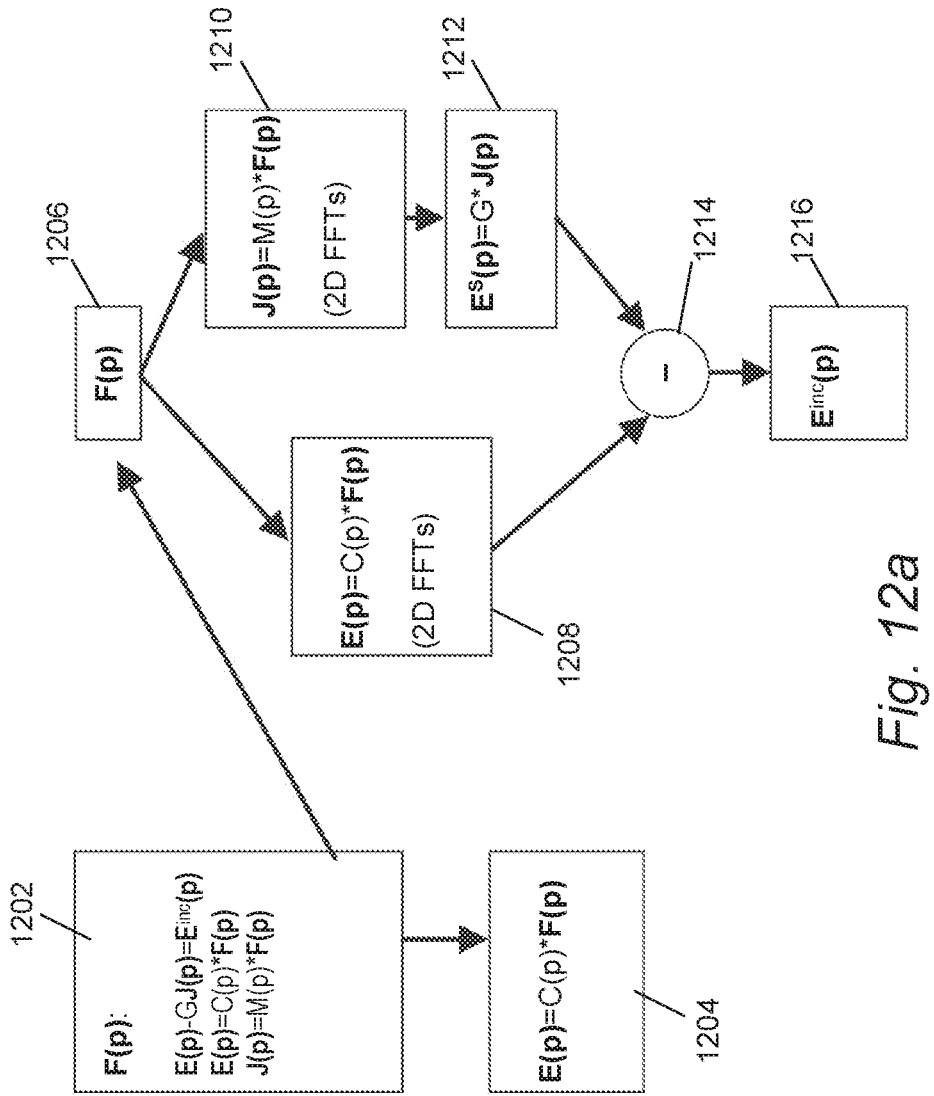
FIGS. 12a and 12b illustrate steps of FIG. 10 in an embodiment of the present invention using a continuous vector field to numerically solve the VIM formula.
Figure 12B:
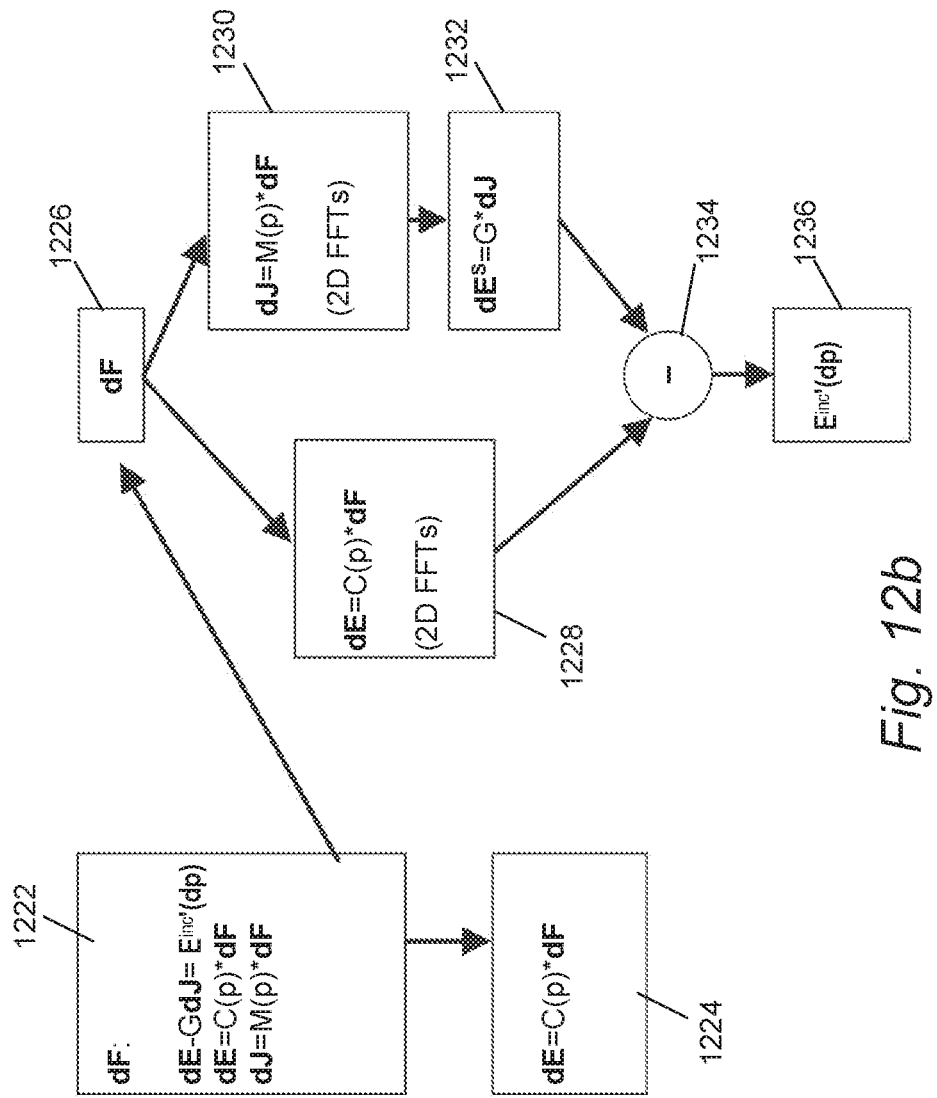

| Term | Notation in equations (1) to (7) | Notation in FIGS. 10, 11a, 11b for electric-field VIM | Notation in FIGS. 10, 12a, 12b for continuous-vector-field VIM |
|---|---|---|---|
| nominal structure | p | — | — |
| structural perturbation | dp | — | — |
| perturbed vector field | x(p + dp) | E(p + dp) | F(p + dp) |
| permittivity operator of nominal linear system | | χ(p) | |
| convolution-and-change-of-basis operator of nominal linear system | | | C(p) |
| convolution operator of nominal linear system | | | M(p) |
| nominal linear system matrix (represents material properties of the nominal structure) | A(p) | 1 − Gχ(p) | C(p) − G M(p) |
| nominal vector field | x(p) | E(p) | F(p) |
| RHS vector (representing incoming EM field in the absence of the structure) | b(p) | $E^{inc}(p)$ | $E^{inc}(p)$ |
| nominal contrast current density | | | J(p) |
| nominal linear system (numerically solved for nominal vector field x(p), E(p), F(p)) | A(p) x(p) = b(p) | E(p) − Gχ(p) E(p) = $E^{inc}(p)$<br>See 1100 in FIG. 11a | C(p)F(p) − G M(p)F(p) = $E^{inc}(p)$<br>or<br>E(p) − G J(p) = $E^{inc}(p)$<br>where E(p) = C(p)F(p)<br>and J(p) = M(p)F(p)<br>See 1202 in FIG. 12a |
| vector field perturbation | dx | dE | dF |
| perturbation of the RHS vector (representing perturbation of the incoming EM field in the absence of the structure) | db | $dE^{inc}$ | $dE^{inc}$ |
| permittivity perturbation | | dχ | |
| convolution-and-change-of-basis operator perturbation | | | dC |
| convolution operator perturbation | | | dM |
| Material-property perturbations | dA | 1 − Gdχ | dC − G dM |
| approximated perturbed linear system RHS vector representing incoming EM field | b'(dp) = db − dA x(p) | $E^{inc'}(dp)$ = $dE^{inc}$ − [E(p) − Gdχ E(p)] | $E^{inc'}(dp)$ = $dE^{inc}$ − [dC F(p) − GdMF(p)] |
| contrast current density perturbation | | | dJ |
| approximated perturbed linear system (numerically solved for dx, dE, dF) | A(p) dx = b'(dp) | dE − Gχ(p) dE = $E^{inc'}(dp)$<br>See 1102 in FIG. 11b | C(p)dF − G M(p)dF = $E^{inc'}(dp)$<br>or<br>dE − G dJ = $E^{inc'}1(dp)$<br>where dE = C(p)dF<br>and dJ = M(p)dF<br>See 1222 in FIG. 12b |

FIG. 10 is a flow chart of a method of calculating electromagnetic scattering properties, in accordance with embodiments of the present invention. It is also descriptive of the adjoint linear system embodiment described with reference to FIG. 13.

This is a method of calculating electromagnetic scattering properties of a structure, the structure being represented as a nominal structure (p) and a structural perturbation (dp). The electromagnetic scattering properties in these examples comprise reflection coefficients.

The structural perturbation comprises a geometric variation, and may comprises line (edge/width) roughness and/or a difference in isotropy of a material, such as amorphous carbon.

At the highest level the first step is pre-processing 1002, including reading the input and preparing FFTs. This involves constructing a nominal linear system matrix (NLSM) (A(p)) to represent material properties (e.g. $\chi(p)$, C(p), M(p)) of the nominal structure (p) independently with respect to the structural perturbation (dp).

At step 1004, a nominal linear system (NLS) (A(p) x(p)=b(p)) according to equation (2) is constructed using the nominal linear system matrix (A(p)) from step 1002.

At step 1006, the perturbed linear system (PLS) of equation (6) (A(p) dx=db−dA x(p)) is approximated using the nominal linear system matrix (A(p)) from step 1002 and by discarding second-order interactions (dAdx) between material-property perturbations (dA) arising from the structural perturbation (dA=A(p+dp)−A(p)) and the vector field perturbation (dx).

At step 1008, equation (2) is solved. This involves numerically solving, using a processing device, a volume integral equation comprising the nominal linear system from step 1004 (A(p) x(p)=b(p)) to determine a nominal vector field (NVF) (x(p)) being independent with respect to the structural perturbation (dp). Step 1008 includes various steps also shown at the left-hand side of FIG. 10. These steps are computing the incident field (IF) 1014, computing the Green's Functions (GF) 1016, computing the update vectors (UV) 1018, updating (UPD) the solution and residual error (e.g. using BiCGstab) 1020 and testing to see if convergence (CNV) is reached 1022. If convergence is not reached control loops back to step 1018 that is the computation of the update vectors. Step 1018 for computing nominal update vectors is described below in more detail with reference to FIGS. 11a and 12a for an electric field VIM and continuous-vector-field VIM respectively.

At step 1010, equation (6) is solved. This involves using a perturbed linear system from step 1006 (A(p) dx=db−dA x(p)) to determine an approximation of a vector field perturbation (VFP) (dx, dr) arising from the structural perturbation (dp).

Step 1010 may be performed in accordance with the electric-field VIM and continuous-vector-field VIM embodiments described with reference to FIGS. 11b and 12b respectively.

In this case, step 1010 may include the steps 1014 to 1022 shown at the left-hand side of FIG. 10. Then, the step 1010 of using the perturbed linear system to determine an approximation of the vector field perturbation (dx) comprises numerically solving, using a processing device, a volume integral equation comprising the perturbed linear system (A(p) dx=db−dA x(p)) to determine an approximate solution of the vector field perturbation (dx). In this case, the step 1012 of calculating electromagnetic scattering properties of the structure comprises using the determined nominal vector field (x(p)) and the determined approximate solution of the vector field perturbation (dx). Step 1018 of computing perturbation update vectors is described below in more detail with reference to FIGS. 11b and 12b for an electric-field VIM and continuous-vector-field VIM respectively.

Alternatively, step 1010 may be performed in accordance with the adjoint linear system embodiment, which will be described with reference to FIG. 13, after we consider substructure.

As shown in FIG. 7a, the structure 706, 712, 718 may have a periodic substructure. Then the nominal linear system may have the substructure nominal linear system of equation (3) ($\hat{A}(p)\ \hat{x}(p)=\hat{b}(p)$) constructed to represent a unit cell 702, 708, 714 of the periodic substructure. In this case, step 1010 of using the perturbed linear system (A(p) dx=db−dA x(p)) to determine an approximation of a vector field perturbation (dx, dr) comprises restricting matrix-vector multiplication of a nominal linear system matrix convolution operator (C(p) M(p)), which operates in a direction of periodicity of the periodic substructure (xy: as opposed to G, which operates in z), with the vector field perturbation (dx, dr), the restricting being to a number of sub-matrices determined by the number of periods of the periodic substructure in the structure. Thus, we can still employ FFTs for the matrix-vector multiplication, but spread out over smaller sub-matrices. This may be applied to electric-field VIM and continuous-vector-field VIM embodiments and in accordance with the adjoint linear system embodiment described with reference to FIG. 13.

The nominal linear system's solution vector (x(p)) may comprise the substructure nominal linear system's solution vector (?(p)) and zero-padding on the harmonics related to the nominal linear system having the substructure, in accordance with equation (4).

Finally, post-processing 1012 is performed in which reflection coefficients (RC) are computed. This involves calculating electromagnetic scattering properties of the structure using the nominal vector field (x(p)) determined at step 1008 and the approximation of the vector field perturbation (dx, dr) determined at step 1010.

FIGS. 11a and 11b illustrate the steps 1008 and 1010 of FIG. 10 respectively in an "electric-field VIM" embodiment of the present invention using a numerical solution of the VIM formula.

With reference to FIG. 11a, this involves numerically solving a volume integral equation for a nominal electric field, E(p), so as to determine a solution of the nominal electric field, E(p). This corresponds to numerically solving, using a processing device, a volume integral equation comprising a nominal linear system (A(p) x(p)=b(p)) to determine a nominal vector field (x(p)) being independent with respect to the structural perturbation (dp).

Furthermore, with reference to FIG. 11b, it involves numerically solving a volume integral equation for an electric field perturbation, dE, so as to determine an approximate solution of the vector field perturbation, dE. This corresponds to using a perturbed linear system (A(p) dx=db−dA x(p)) to determine an approximation of a vector field perturbation (dx, dr) arising from the structural perturbation (dp).

In more detail, FIG. 11a shows the step 1100 of solving the VIM system for a nominal electric field, E(p). The VIM system is solved iteratively. The first time that E(p) is set up, it can be started from zero. After that initial step, the estimates of E(p) are guided by the iterative solver and the residual. The nominal contrast current density, J(p), is computed using a convolution of a nominal permittivity operator, $\chi(p)$, with the nominal electric field, E(p). This is performed for each sample point in z with the convolution being performed via 2D FFTs. The convolutions and rank-1 projections between the Green's function, G, and the nominal contrast current density, J(p), are computed to yield the nominal scattered electric field, $E^s(p)=GJ(p)$. The convolution may be performed using a transformation such as one selected from a set comprising a fast Fourier transform (FFT) and number-theoretic transform (NTT). The computed result $E^s(p)$ is subtracted from E(p) to obtain $E^{inc}(p)$.

FIG. 11b shows the step 1102 of solving the VIM system for an electric field perturbation, dE. The VIM system is solved iteratively. The first time that dE is set up, it can be started from zero. After that initial step, the estimates of dE are guided by the iterative solver and the residual. The contrast current density perturbation, dJ, is computed using a convolution of the nominal permittivity operator, $\chi(p)$, with the electric field perturbation, dE. This is performed for each sample point in z with the convolution being performed via 2D FFTs. The convolutions and rank-1 projections between the Green's function, G, and the contrast current density perturbation, dJ, are computed to yield the scattered electric field perturbation, $dE^s=GdJ$. The convolution may be performed using a transformation such as one selected from a set comprising a fast Fourier transform (FFT) and number-theoretic transform (NTT). The computed result $dE^s$ is subtracted from dE to obtain $E^{inc'}(dp)$.

FIGS. 12a and 12b illustrate the steps 1008 and 1010 of FIG. 10 respectively in a "continuous-vector-field VIM" embodiment of the present invention using a continuous vector field to numerically solve the VIM formula. The structure is periodic in at least one direction and includes materials of differing properties such as to cause discontinuities in a nominal electromagnetic field, E(p), and an electromagnetic field perturbation, dE, respectively at a material boundary, and the nominal vector field, F(p), and vector field perturbation, dF, are related to the nominal electromagnetic field, E(p), and electromagnetic field perturbation, dE, respectively by a change of basis and are constructed to be continuous at the material boundary.

With reference to FIG. 12a, using a continuous vector field to numerically solve the VIM formula involves numerically solving a volume integral equation for a nominal continuous vector field, F(p), that is related to the nominal electric field, E(p), by a change of basis, the nominal continuous vector field, F(p), being continuous at one or more material boundaries, so as to determine a solution of the nominal continuous vector field. F(p). This corresponds to numerically solving, using a processing device, a volume integral equation comprising a nominal linear system (A(p) x(p)=b(p)) to determine a nominal vector field (x(p)) being independent with respect to the structural perturbation (dp).

Furthermore, with reference to FIG. 12b, it involves numerically solving a volume integral equation for a continuous vector field perturbation, dF, that is related to the electric field perturbation, dE, by a change of basis, the continuous vector field perturbation, dF, being continuous at one or more material boundaries, so as to determine a solution of the continuous vector field perturbation, dF. This corresponds to using a perturbed linear system (A(p) dx=db−dA x(p)) to determine an approximation of a vector field perturbation (dx, dr) arising from the structural perturbation (dp).

In more detail, FIG. 12a shows the step 1202 of solving the VIM system for a nominal continuous vector field, F(p), with a post-processing step 1204 to obtain a total nominal electric field, E(p), by convolution of the approximate solution of the nominal continuous vector field, F(p), with the nominal convolution-and-change-of-basis operator, C(p). The convolution may be performed using a transformation such as one selected from a set comprising a fast Fourier transform (FFT) and number-theoretic transform (NTT). FIG. 12a also shows at the right-hand side a schematic illustration of performing an efficient matrix-vector product 1206 to 1216 to solve the VIM system iteratively. This starts with a nominal continuous vector field, F(p), in step 1206. The first time that F(p) is set up, it can be started from zero. After that initial step, the estimates of F(p) are guided by the iterative solver and the residual. Next the total nominal electric field, E(p), is computed 1208 using the convolution of a nominal convolution-and-change-of-basis operator, C(p), with the nominal continuous vector field, F(p), via 2D FFTs for each sample point in the z direction. The nominal convolution-and-change-of-basis operator, C(p), is configured to transform the basis of the nominal continuous vector field, F(p), to the basis of the total nominal electric field, E(p). Also, the nominal contrast current density, J(p), is computed in step 1210 using a convolution of a nominal material convolution operator, M(p), with the nominal continuous vector field, F(p). Step 1210 is performed for each sample point in z with the convolution being performed via 2D FFTs. In step 1212 the convolutions and rank-1 projections between the Green's function, G. and the nominal contrast current density, J(p), are computed to yield the nominal scattered electric field, $E^s(p)$. The convolution may be performed using a transformation such as one selected from a set comprising a fast Fourier transform (FFT) and number-theoretic transform (NTT). Operation 1214 subtracts the two computed results $E^s(p)$ from E(p) to obtain $E^{inc}(p)$ 1216. Because steps 1206 to 1216 produce update vectors then the post-processing step 1204 is used to produce the final value of the total nominal electric field, E(p).

Rather than a separate post-processing step 1204 the sum of all the update vectors may be recorded at step 1208 in order to calculate the total nominal electric field, E(p). However, that approach increases the storage requirements of the method, whereas the post-processing step 1204 is not costly in storage or processing time, compared to the iterative steps 1206 to 1216.

FIG. 12b shows the step 1222 of solving the VIM system for a continuous vector field perturbation, dF, with a post-processing step 1224 to obtain a total electric field perturbation, dE, by convolution of the approximate solution of the vector field perturbation, dF, with the nominal convolution-and-change-of-basis operator, C(p). The convolution may be performed using a transformation such as one selected from a set comprising a fast Fourier transform (FFT) and number-theoretic transform (NTT). FIG. 12b also shows at the right-hand side a schematic illustration of performing an efficient matrix-vector product 1226 to 1236 to solve the VIM system iteratively. This starts with a continuous vector field perturbation, dF, in step 1226. The first time that dF is set up, it can be started from zero. After that initial step, the estimates of dF are guided by the iterative solver and the residual. Next the total electric field perturbation, dE, is computed 1228 using the convolution of a nominal convolution-and-change-of-basis operator, C(p), with the continuous vector field perturbation, dF, via 2D FFTs for each sample point in the z direction. The nominal convolution-and-change-of-basis operator, C(p), is configured to transform the basis of the continuous vector field perturbation, dF, to the basis of the total electric field perturbation, dE. Also, the contrast current density perturbation, dJ, is computed in step 1230 using a convolution of a nominal material convolution operator, M(p), with the continuous vector field perturbation, dF. Step 1230 is performed for each sample point in z with the convolution being performed via 2D FFTs. In step 1232 the convolutions and rank-1 projections between the Green's function, G, and the contrast current density perturbation, dJ, are computed to yield the scattered electric field perturbation, $dE^s$. The convolution may be performed using a transformation such as one selected from a set comprising a fast Fourier transform (FFT) and number-theoretic transform (NTT). Operation 1234 subtracts the two computed results $dE^s$ from dE to obtain an approximation of $E^{inc'}(dp)$ 1236. Because steps 1226 to 1236 produce update vectors then the post-processing step 1224 is used to produce the final value of the total electric field perturbation, dE.

Rather than a separate post-processing step 1224 the sum of all the update vectors may be recorded at step 1228 in order to calculate the total electric field perturbation, dE. However, that approach increases the storage requirements of the method, whereas the post-processing step 1224 is not costly in storage or processing time, compared to the iterative steps 1226 to 1236.

Figure 13:
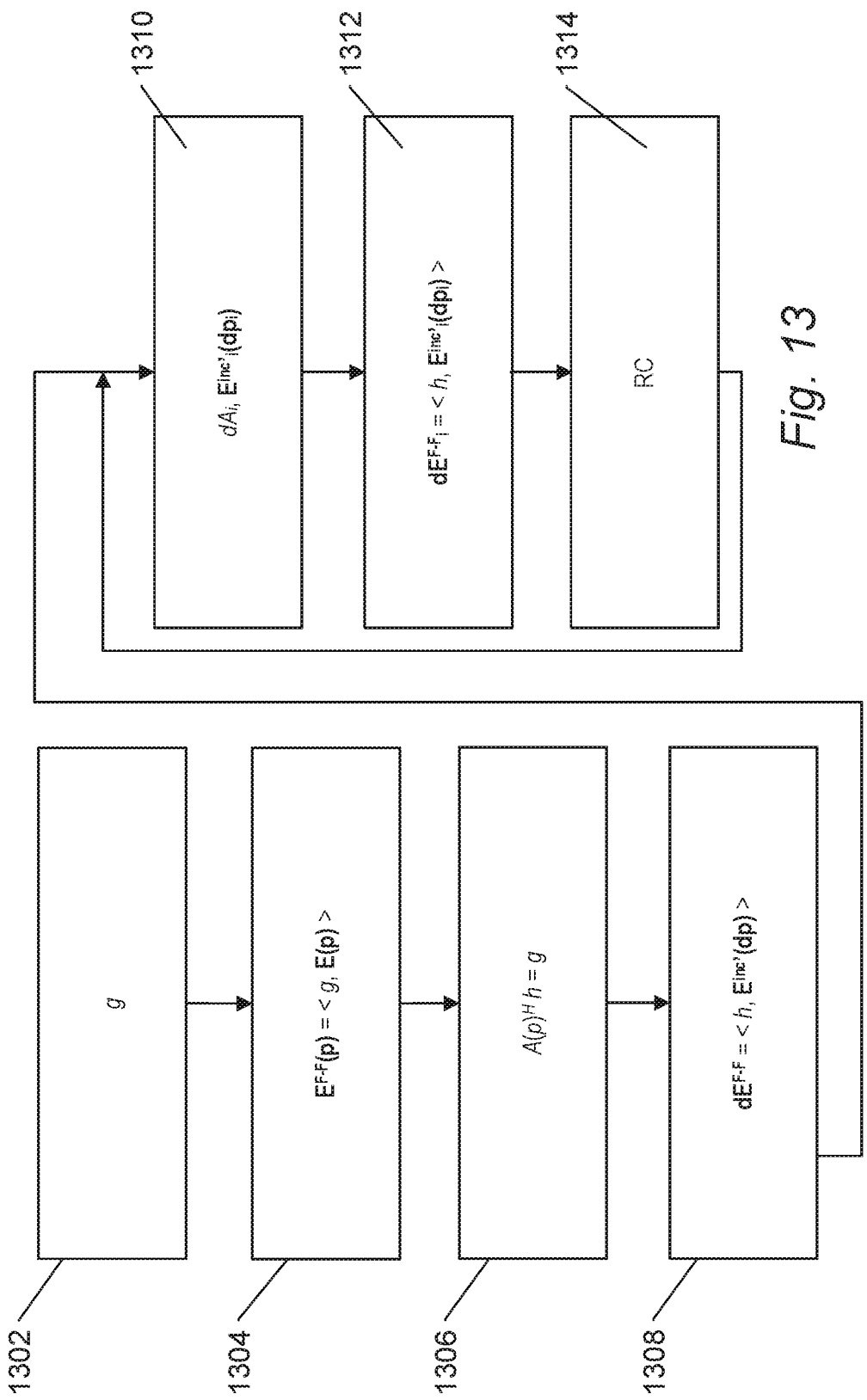
FIG. 13 illustrates a step of FIG. 10 in an embodiment of the present invention using an adjoint linear system to determine the vector field perturbation.

FIG. 13 illustrates the step 1010 of FIG. 10 in an embodiment of the present invention using an adjoint linear system to determine the vector field perturbation. In this embodiment, instead of solving the perturbed linear system, such as described with reference to FIGS. 11*b* and 12*b*, the adjoint is solved. In the description of FIG. 13 below, the notation of equations (8) to (10) is given in parenthesis.

The vector field perturbation (dx) comprises a far-field vector field perturbation $dE^{F-F}$ (dr) and the step 1010 of using the perturbed linear system to determine an approximation of the vector field perturbation dE (dx) involves the following steps:

1302: defining a selection vector (g) constructed to select one or more far-field diffraction order of interest;

1304: determining a nominal far-field vector field $E^{F-F}(p)$ (r(p)) by performing an inner product $<g, x(p)>$ of the selection vector (g) and the nominal vector field $E(p)$ (x(p)) determined at step 1008 in FIG. 10;

1306: solving the adjoint linear system of equation (10) $(A(p)^H h = g)$ having a system matrix being the Hermitian transpose $(A(p)^H)$ of the nominal linear system matrix constructed at step 1002 (A(p)), and having the selection vector (g) as its right-hand side, to determine an adjoint solution vector (h);

1308: determining the approximation of the far-field vector field perturbation $dE^{F-F}(dr)$ in accordance with equation (9) by performing an inner product of the adjoint solution vector (h) from step 1306 and the right-hand side vector $E^{inc'}(dp)$ (b'(dp)=db−dA x(p)) of the perturbed linear system of step 1006 in FIG. 10 (A(p) dx=db−dA x(p)). The step 1012 in FIG. 10 of calculating electromagnetic scattering properties of the structure comprises using the nominal far-field vector field $E^{F-F}(p)$ (r(p)) determined at step 1304 and the approximation of the far-field vector field perturbation $dE^{F-F}$ (dr) determined at step 1308;

1310: computing a second right-hand side vector $E^{inc'}_i$ $(dp_i)$ $(db_i'=db_i-dA_i\ x(p))$ of a second perturbed linear system $(A(p)\ dx_i=db_i-dA_i\ x(p))$ that is defined in terms of a second material-property perturbation $(dA_i)$ arising from a second structural perturbation $(dp_i)$. Here, i=2, 3, 4 . . . , thus steps 1302-1308 relate to the first perturbed structure and steps 1310-1314 relate to the second and subsequent perturbed structure;

1312: determining the approximation of a second far-field vector field perturbation $dE^{F-F}_i$ $(dr_i)$ in accordance with equation (9) by performing an inner product of the adjoint solution vector (h) from step 1306 and the second right-hand side vector $E^{inc'}_i(dp_i)$ $(db_i'=db_i-dA_i\ x(p))$ of the second perturbed linear system $(A(p)\ dx_i=db_i-dA_i\ x(p))$ from step 1310; and

1314: calculating electromagnetic scattering properties, such as reflection coefficients (RC), of a second structure by using the nominal far-field vector field $E^{F-F}(p)$ (r(p)) determined at step 1304 and the approximation of the second far-field vector field perturbation $dE^{F-F}_i$ $(dr_i)$ determined at step 1312.

The method of may further comprise determining a probability density function of electromagnetic scattering properties for a plurality of structural perturbations using the calculated electromagnetic scattering properties of a plurality of structures including the second structure.

Figure 14:
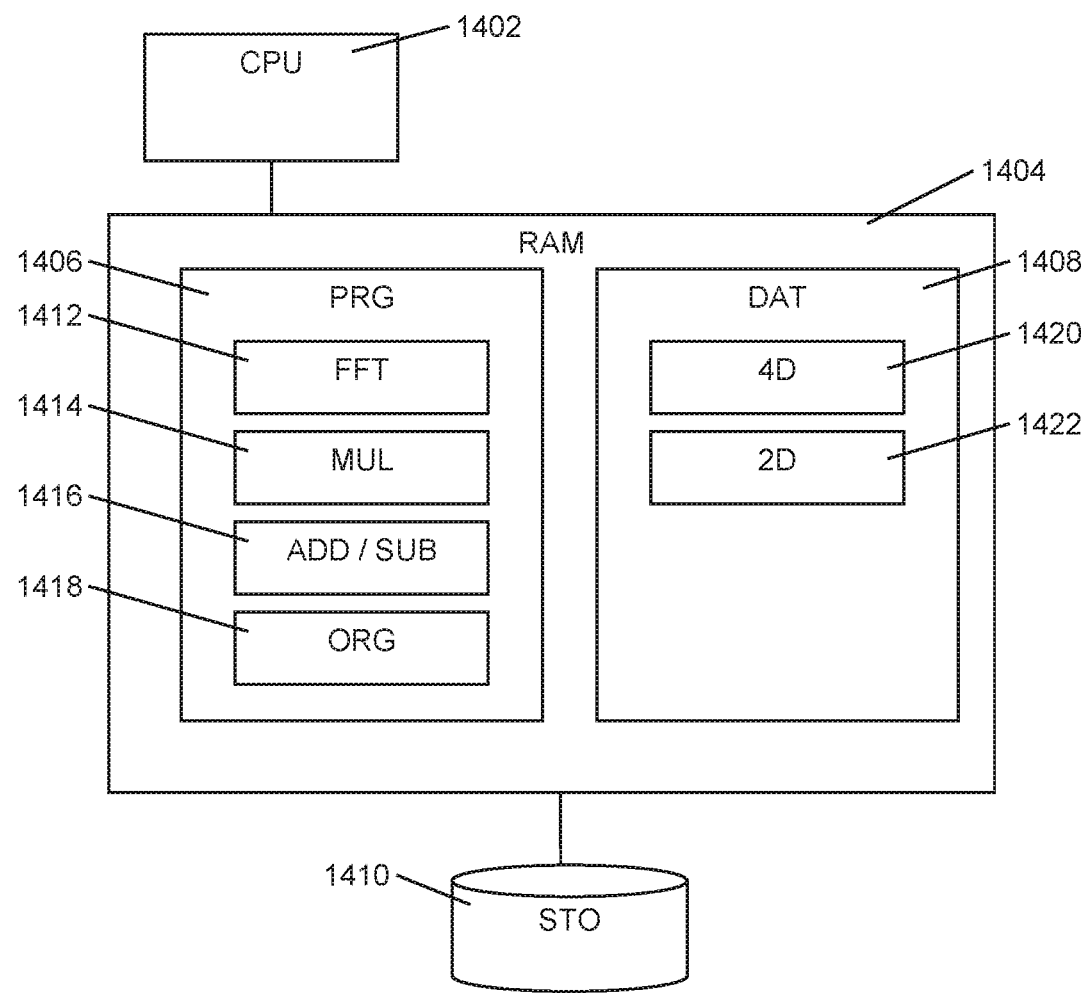
FIG. 14 depicts in schematic form a computer system configured with programs and data in order to execute a method in accordance with an embodiment of the present invention.

FIG. 14 shows in schematic form a computer system configured with programs and data in order to execute a method in accordance with an embodiment to the present invention. The computer system comprises a central processing unit (CPU) 1402 and random-access memory (RAM) 1404 which is used to store the program (PRG) instructions 1406 and data (DAT) 1408 during execution of the program. The computer system also includes disk storage (STO) 1410 that is used to store program instructions and data before and after the execution of the program.

The program instructions 1406 include Fast Fourier Transform routines 1412, matrix multiplication (MUL) functions 1414, other arithmetic functions such as addition (ADD) and subtraction (SUB) 1416 and array organizing (ORG) functions 1418. The data (DAT) 1408 comprises the 4D array 1420 and 2D arrays 1422 used during calculation of the solution of the VIM system. Other conventional computer components for input and output are not shown.

Embodiments of the present invention provide a substantial speed-improvement by applying a perturbation analysis (for specific input structures) and exploiting special (sparsity) properties in the resulting linear system. This allows simulation of significantly large computing domains compared to the illumination wavelength λ (e.g. >100λ square) and/or random scattering media.

Embodiments involve re-using the solution of a single adjoint linear system for the calculation of all required electromagnetic responses. This obtains a substantial speed-improvement by exploiting two key properties of the analyzed problems: (a) the system matrix is independent of the perturbation; and (b) the far-field electromagnetic response that we are interested in has a low-dimensional character (as opposed to the high-dimensional character of the near-field electromagnetic response). For LER/LWR embodiments may be used to compute the probability density function of measured intensities, thus leading to a complete characterization of roughness.

Embodiments may also be implemented for applications other than LER/LWR, as long as they can be cast in the form of a perturbation with respect to a nominal profile. The nominal profile may or may not contain repeating geometries (substructure) within the computational domain. Examples include: (a) generation of libraries for small parameter ranges; (b) characterizing the quality of a computer-generated hologram containing gradually varying objects; and (c) simulation of overlay targets with induced CD variations.

The embodiments described with reference to FIGS. 7 to 14 may be implemented for reconstruction of a structure from scatterometer measurements, as described with reference to FIGS. 5 and 6. This provides a method of reconstructing a structure of an object in an inspection apparatus, the method comprising:

determining, using a processing device, a model of an electromagnetic scattering property of an estimated structure of the object, wherein the determining comprises calculating electromagnetic scattering properties of the structure in accordance with any of the embodiments described with reference to FIGS. 7 to 14;

detecting an electromagnetic scattering property of the object; and comparing, using the processing device, the detected electromagnetic scattering property to the model of the electromagnetic scattering property.

It may also provide a method of reconstructing a structure of an object from a detected electromagnetic scattering property arising from illumination of the object by radiation, may comprise the steps:

estimating at least one object structure;

determining at least one model electromagnetic scattering property from the at least one estimated object structure;

comparing the detected electromagnetic scattering property to the at least one model electromagnetic scattering property; and determining an object structure based on the result of the comparison, wherein the model electromagnetic scattering property is determined using a method of calculating electromagnetic scattering properties of a structure in accordance with any of the embodiments described with reference to FIGS. 7 to 14.

The method may further comprise arranging a plurality of the model electromagnetic scattering properties in a library and the step of comparing comprises matching the detected electromagnetic scattering property to contents of the library.

The method may further comprise iterating the steps of estimating at least one object structure, determining at least one model electromagnetic scattering property, and comparing the detected electromagnetic scattering wherein the step of estimating at least one object structure is based on the result of the step of comparing in a previous iteration.

With reference to FIGS. 3 and 4, an inspection system SM1, SM2 may be provided for reconstructing an approximate structure of an object. The inspection system comprises an illumination system 2 configured to illuminate the object with radiation. A detection system 4, 18 is configured to detect an electromagnetic scattering property arising from the illumination. A processor PU is configured to:

estimate at least one structural parameter;

determine at least one model electromagnetic scattering property from said at least one structural parameter;

compare said detected electromagnetic scattering property to said at least one model electromagnetic scattering property; and determine an approximate object structure from a difference between said detected electromagnetic scattering property and said at least one model electromagnetic scattering property, The processor PU is configured to determine the model electromagnetic scattering property using a method in accordance with any of the embodiments described with reference to FIGS. 7 to 14.

The inspection system may be incorporated into the lithographic cell LC illustrated in FIG. 2.

Further embodiments are disclosed in the subsequent numbered clauses:

1. A method of calculating electromagnetic scattering properties of a structure, the structure being represented as a nominal structure and a structural perturbation, the method comprising:

(d) numerically solving, using a processing device, a volume integral equation comprising a nominal linear system to determine a nominal vector field being independent with respect to the structural perturbation;

(e) using a perturbed linear system to determine an approximation of a vector field perturbation arising from the structural perturbation; and (f) calculating electromagnetic scattering properties of the structure using the determined nominal vector field and the determined approximation of the vector field perturbation.

2. The method of clause 1 further comprising:

(a) constructing a nominal linear system matrix to represent material properties of the nominal structure independently with respect to the structural perturbation;

(b) constructing the nominal linear system using the nominal linear system matrix; and (c) approximating the perturbed linear system using the nominal linear system matrix and by discarding second-order interactions between material-property perturbations arising from the structural perturbation and the vector field perturbation.

3. The method of clause 1 or clause 2, wherein the vector field perturbation comprises a far-field vector field perturbation and:

the step (e) of using the perturbed linear system to determine an approximation of the vector field perturbation comprises:

(e1) defining a selection vector constructed to select one or more far-field diffraction order of interest;

(e2) determining a nominal far-field vector field by performing an inner product of the selection vector and the determined nominal vector field;

(e3) solving an adjoint linear system having a system matrix being the Hermitian transpose of a nominal linear system matrix, and having the selection vector (g) as its right-hand side, to determine an adjoint solution vector;

(e4) determining the approximation of the far-field vector field perturbation by performing an inner product of the adjoint solution vector and the right-hand side vector of the perturbed linear system; and the step (f) of calculating electromagnetic scattering properties of the structure comprises using the determined nominal far-field vector field and the determined approximation of the far-field vector field perturbation.

4. The method of clause 3, further comprising:

(g) computing a second right-hand side vector of a second perturbed linear system that is defined in terms of a second material-property perturbation arising from a second structural perturbation;

(h) determining the approximation of a second far-field vector field perturbation by performing an inner product of the adjoint solution vector and the second right-hand side vector of the second perturbed linear system; and (i) calculating electromagnetic scattering properties of a second structure by using the determined nominal far-field vector field and the determined approximation of the second far-field vector field perturbation.

5. The method of clause 4, further comprising determining a probability density function of electromagnetic scattering properties for a plurality of structural perturbations using the calculated electromagnetic scattering properties of a plurality of structures including the second structure.

6. The method of clause 1 or clause 2 wherein:

the step (e) of using the perturbed linear system to determine an approximation of the vector field perturbation comprises numerically solving, using a processing device, a volume integral equation comprising the perturbed linear system to determine an approximate solution of the vector field perturbation;

the step (f) of calculating electromagnetic scattering properties of the structure comprises using the determined nominal vector field and the determined approximate solution of the vector field perturbation.

7. The method of any preceding clause, wherein the structure has a periodic substructure and the nominal linear system comprises a substructure nominal linear system constructed to represent a unit cell of the periodic substructure.

8. The method of clause 7, wherein step (e) of using the perturbed linear system to determine an approximation of a vector field perturbation comprises restricting matrix-vector multiplication of a nominal linear system matrix convolution operator, which operates in a direction of periodicity of the periodic substructure, with the vector field perturbation, the restricting being to a number of sub-matrices determined by the number of periods of the periodic substructure in the structure.

9. The method of clause 7 or clause 8, wherein the nominal linear system's solution vector comprises the substructure nominal linear system's solution vector and zero-padding on the harmonics related to the nominal linear system having the substructure.

10. The method of any preceding clause, wherein the structure is periodic in at least one direction and includes materials of differing properties such as to cause discontinuities in a nominal electromagnetic field and an electromagnetic field perturbation respectively at a material boundary, and the nominal vector field and vector field perturbation are related to the nominal electromagnetic field and electromagnetic field perturbation respectively by a change of basis and are constructed to be continuous at the material boundary.

11. The method of any preceding clause, wherein the electromagnetic scattering properties comprise reflection coefficients.

12. The method of any preceding clause, wherein the structural perturbation comprises a geometric variation.

13. The method of any preceding clause, wherein the structural perturbation comprises line roughness.

14. The method of any preceding clause, wherein the structural perturbation comprises a difference in isotropy of a material.

15. A method of reconstructing a structure of an object in an inspection apparatus, the method comprising:

determining, using a processing device, a model of an electromagnetic scattering property of an estimated structure of the object, wherein the determining comprises calculating electromagnetic scattering properties of the structure in accordance with any preceding clause;

detecting an electromagnetic scattering property of the object; and comparing, using the processing device, the detected electromagnetic scattering property to the model of the electromagnetic scattering property.

16. A method of reconstructing a structure of an object from a detected electromagnetic scattering property arising from illumination of the object by radiation, the method comprising the steps:

estimating at least one object structure;

determining at least one model electromagnetic scattering property from the at least one estimated object structure;

comparing the detected electromagnetic scattering property to the at least one model electromagnetic scattering property; and determining an object structure based on the result of the comparison, wherein the model electromagnetic scattering property is determined using a method of calculating electromagnetic scattering properties of a structure according to any of clauses 1 to 14.

17. A method according to clause 16, further comprising the step of arranging a plurality of the model electromagnetic scattering properties in a library and the step of comparing comprises matching the detected electromagnetic scattering property to contents of the library.

18. A method according to clause 16 or clause 17, further comprising iterating the steps of estimating at least one object structure, determining at least one model electromagnetic scattering property, and comparing the detected electromagnetic scattering wherein the step of estimating at least one object structure is based on the result of the step of comparing in a previous iteration.

19. An inspection system for reconstructing an approximate structure of an object, the inspection system comprising:

an illumination system configured to illuminate said object with radiation;

a detection system configured to detect an electromagnetic scattering property arising from said illumination:

a processor configured to:

estimate at least one structural parameter;

determine at least one model electromagnetic scattering property from said at least one structural parameter;

compare said detected electromagnetic scattering property to said at least one model electromagnetic scattering property; and determine an approximate object structure from a difference between said detected electromagnetic scattering property and said at least one model electromagnetic scattering property, wherein said processor is configured to determine said model electromagnetic scattering property using a method according to any of clauses 1 to 14.

20. A lithographic cell comprising the inspection system of clause 19.

21. A computer program product containing one or more sequences of machine-readable instructions for calculating electromagnetic scattering properties of a structure, the instructions being adapted to cause one or more processors to perform a method according to any of clauses 1 to 14.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The methods according to embodiments of the present invention described above may be incorporated into the forward diffraction model for reconstructing an approximate structure of an object (not limited to 1D-periodic) from a detected electromagnetic scattering property, such as a diffraction pattern, arising from illumination of the object by radiation, as described above with reference to FIGS. 5 and 6. The processing unit PU described above with reference to FIGS. 3 and 4 may be configured to reconstruct an approximate structure of an object using this method.

Although specific reference is made in this text to "metrology apparatus" or "metrology system", these terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves may be calculated for example using reflection coefficients.

Thus, although embodiments of the present invention are described in relation to reflective scattering, the invention is also applicable to transmissive scattering.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of calculating electromagnetic scattering properties of a structure, the structure being represented as a nominal structure and a structural perturbation, the method comprising:
   numerically solving, using a processing device, a volume integral equation comprising a nominal linear system to determine a nominal vector field being independent with respect to the structural perturbation;
   using a perturbed linear system to determine an approximation of a vector field perturbation arising from the structural perturbation; and
   calculating electromagnetic scattering properties of the structure using the determined nominal vector field and the determined approximation of the vector field perturbation.

2. The method of claim 1, further comprising:
   constructing a nominal linear system matrix to represent material properties of the nominal structure independently with respect to the structural perturbation;
   constructing the nominal linear system using the nominal linear system matrix; and
   approximating the perturbed linear system using the nominal linear system matrix and by discarding second-order interactions between material-property perturbations arising from the structural perturbation and the vector field perturbation.

3. The method of claim 1, wherein:
   the vector field perturbation comprises a far-field vector field perturbation; and
   the using the perturbed linear system to determine an approximation of the vector field perturbation comprises:
      defining a selection vector constructed to select one or more far-field diffraction order of interest;
      determining a nominal far-field vector field by performing an inner product of the selection vector and the determined nominal vector field;
      solving an adjoint linear system having a system matrix being the Hermitian transpose of a nominal linear system matrix, and having the selection vector (g) as its right-hand side, to determine an adjoint solution vector;
      determining the approximation of the far-field vector field perturbation by performing an inner product of the adjoint solution vector and the right-hand side vector of the perturbed linear system; and
   the calculating electromagnetic scattering properties of the structure comprises using the determined nominal far-field vector field and the determined approximation of the far-field vector field perturbation.

4. The method of claim 3, further comprising:
computing a second right-hand side vector of a second perturbed linear system that is defined in terms of a second material-property perturbation arising from a second structural perturbation;
determining the approximation of a second far-field vector field perturbation by performing an inner product of the adjoint solution vector and the second right-hand side vector of the second perturbed linear system; and
calculating electromagnetic scattering properties of a second structure by using the determined nominal far-field vector field and the determined approximation of the second far-field vector field perturbation.

5. The method of claim 4, further comprising determining a probability density function of electromagnetic scattering properties for a plurality of structural perturbations using the calculated electromagnetic scattering properties of a plurality of structures including the second structure.

6. The method of claim 1, wherein:
the using the perturbed linear system to determine an approximation of the vector field perturbation comprises numerically solving, using a processing device, a volume integral equation comprising the perturbed linear system to determine an approximate solution of the vector field perturbation; and
the calculating electromagnetic scattering properties of the structure comprises using the determined nominal vector field and the determined approximate solution of the vector field perturbation.

7. The method of claim 1, wherein:
the structure has a periodic substructure;
the nominal linear system comprises a substructure nominal linear system constructed to represent a unit cell of the periodic substructure; and
the using the perturbed linear system to determine an approximation of a vector field perturbation comprises restricting matrix-vector multiplication of a nominal linear system matrix convolution operator, which operates in a direction of periodicity of the periodic substructure, with the vector field perturbation, the restricting being to a number of sub-matrices determined by the number of periods of the periodic substructure in the structure.

8. The method of claim 7, wherein the nominal linear system's solution vector comprises the substructure nominal linear system's solution vector and zero-padding on the harmonics related to the nominal linear system having the substructure.

9. The method of claim 1, wherein:
the structure is periodic in at least one direction and includes materials of differing properties such as to cause discontinuities in a nominal electromagnetic field and an electromagnetic field perturbation respectively at a material boundary; and
the nominal vector field and vector field perturbation is related to the nominal electromagnetic field and electromagnetic field perturbation respectively by a change of basis and are constructed to be continuous at the material boundary.

10. The method of claim 1, wherein the electromagnetic scattering properties comprise reflection coefficients.

11. The method of claim 1, wherein the structural perturbation comprises at least one of a geometric variation, line roughness, or a difference in isotropy of a material.

12. A method of reconstructing a structure of an object in an inspection apparatus, the method comprising:
determining, using a processing device, a model of an electromagnetic scattering property of an estimated structure of the object, the determining comprising calculating electromagnetic scattering properties of the structure; the calculating comprising:
numerically solving, using a processing device, a volume integral equation comprising a nominal linear system to determine a nominal vector field being independent with respect to a structural perturbation;
using a perturbed linear system to determine an approximation of a vector field perturbation arising from the structural perturbation; and
calculating electromagnetic scattering properties of the structure using the determined nominal vector field and the determined approximation of the vector field perturbation;
detecting an electromagnetic scattering property of the object; and
comparing, using the processing device, the detected electromagnetic scattering property to the model of the electromagnetic scattering property.

13. A method of reconstructing a structure of an object from a detected electromagnetic scattering property arising from illumination of the object by radiation, the method comprising:
estimating at least one object structure;
determining at least one model electromagnetic scattering property from at least one estimated object structure;
comparing the detected electromagnetic scattering property to the at least one model electromagnetic scattering property; and
determining an object structure based on the result of the comparison, wherein the model electromagnetic scattering property is determined using a method of calculating electromagnetic scattering properties of a structure, the calculating comprising:
numerically solving, using a processing device, a volume integral equation comprising a nominal linear system to determine a nominal vector field being independent with respect to a structural perturbation;
using a perturbed linear system to determine an approximation of a vector field perturbation arising from the structural perturbation; and
calculating electromagnetic scattering properties of the structure using the determined nominal vector field and the determined approximation of the vector field perturbation.

14. An inspection system for reconstructing an approximate structure of an object; the inspection system comprising:
an illumination system configured to illuminate the object with radiation;
a detection system configured to detect an electromagnetic scattering property arising from the illumination; and
a processor configured to:
estimate at least one structural parameter;
determine at least one model electromagnetic scattering property from the at least one structural parameter;
compare the detected electromagnetic scattering property to the at least one model electromagnetic scattering property; and
determine an approximate object structure from a difference between the detected electromagnetic scattering property and the at least one model electromagnetic scattering property, wherein the processor is configured to determine the model electromagnetic scattering property by:
  numerically solving, using a processing device, a volume integral equation comprising a nominal linear system to determine a nominal vector field being independent with respect to a structural perturbation;
  using a perturbed linear system to determine an approximation of a vector field perturbation arising from the structural perturbation; and
  calculating electromagnetic scattering properties of the structure using the determined nominal vector field and the determined approximation of the vector field perturbation.

15. A non-transitory computer program product containing one or more sequences of machine-readable instructions for calculating electromagnetic scattering properties of a structure, the instructions being adapted to cause one or more processors to perform operations comprising:
  estimating at least one object structure;
  determining at least one model electromagnetic scattering property from at least one estimated object structure;
  comparing the detected electromagnetic scattering property to the at least one model electromagnetic scattering property; and
  determining an object structure based on the result of the comparison, wherein the model electromagnetic scattering property is determined using a method of calculating electromagnetic scattering properties of a structure, the calculating comprising:
    numerically solving, using a processing device, a volume integral equation comprising a nominal linear system to determine a nominal vector field being independent with respect to a structural perturbation;
    using a perturbed linear system to determine an approximation of a vector field perturbation arising from the structural perturbation; and
    calculating electromagnetic scattering properties of the structure using the determined nominal vector field and the determined approximation of the vector field perturbation.

* * * * *